US009634642B2

United States Patent
Burak et al.

(10) Patent No.: US 9,634,642 B2
(45) Date of Patent: Apr. 25, 2017

(54) ACOUSTIC RESONATOR COMPRISING VERTICALLY EXTENDED ACOUSTIC CAVITY

(71) Applicant: Avago Technologies General IP (Singapore) Pte. Ltd., Singapore (SG)

(72) Inventors: Dariusz Burak, Fort Collins, CO (US); Stefan Bader, Fort Collins, CO (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 421 days.

(21) Appl. No.: 14/292,043

(22) Filed: May 30, 2014

(65) Prior Publication Data

US 2015/0349743 A1    Dec. 3, 2015

(51) Int. Cl.
    *H01L 41/047*     (2006.01)
    *H03H 9/17*     (2006.01)
    *H01L 41/107*     (2006.01)
    *H03H 9/13*     (2006.01)

(52) U.S. Cl.
CPC .............. *H03H 9/17* (2013.01); *H01L 41/047* (2013.01); *H01L 41/107* (2013.01); *H03H 9/131* (2013.01); *H03H 9/132* (2013.01); *H03H 9/174* (2013.01); *H03H 9/175* (2013.01)

(58) Field of Classification Search
CPC ........ H01L 41/047; H01L 41/107; H03H 9/17
USPC ........................................ 310/321, 364, 365
See application file for complete search history.

(56) References Cited

U.S. PATENT DOCUMENTS

| 5,587,620 | A | 12/1996 | Ruby et al. |
|---|---|---|---|
| 5,873,153 | A | 2/1999 | Ruby et al. |
| 6,107,721 | A | 8/2000 | Lakin |
| 6,384,697 | B1 | 5/2002 | Ruby |
| 6,507,983 | B1 | 1/2003 | Ruby et al. |
| 6,548,943 | B2 | 4/2003 | Kaitila et al. |
| 6,734,600 | B2 | 5/2004 | Aigner et al. |
| 7,275,292 | B2 | 10/2007 | Ruby et al. |
| 7,280,007 | B2 | 10/2007 | Feng et al. |
| 7,345,410 | B2 | 3/2008 | Grannen et al. |
| 7,358,831 | B2 | 4/2008 | Larson, III et al. |
| 7,388,454 | B2 | 6/2008 | Ruby et al. |
| 7,629,865 | B2 | 12/2009 | Ruby |
| 2007/0205850 | A1 | 9/2007 | Jamneala et al. |
| 2008/0143215 | A1* | 6/2008 | Hara ........................ H03H 3/04 310/328 |
| 2008/0258842 | A1 | 10/2008 | Ruby et al. |

(Continued)

OTHER PUBLICATIONS

Co-pending U.S. Appl. No. 13/662,425, filed Oct. 27, 2012.

(Continued)

*Primary Examiner* — Derek Rosenau

(57) ABSTRACT

A bulk acoustic wave (BAW) resonator having a vertically extended acoustic cavity is provided. The BAW resonator includes a bottom electrode disposed on a substrate over a cavity formed in the substrate; a piezoelectric layer disposed on the bottom electrode, and a top electrode disposed on the piezoelectric layer. The piezoelectric layer has a thickness of approximately λ/2, wherein λ is a wavelength corresponding to a thickness extensional resonance frequency of the BAW resonator. At least one of the bottom electrode and the top electrode comprises a composite electrode having a thickness of approximately λ/2.

20 Claims, 10 Drawing Sheets

(56) References Cited

U.S. PATENT DOCUMENTS

| | | | |
|---|---|---|---|
| 2010/0117762 A1* | 5/2010 | Taniguchi | H03H 3/02 333/187 |
| 2010/0148638 A1 | 6/2010 | Umeda | |
| 2010/0327697 A1 | 12/2010 | Choy et al. | |
| 2010/0327994 A1 | 12/2010 | Choy et al. | |
| 2011/0006860 A1* | 1/2011 | Hara | H03H 3/02 333/187 |
| 2011/0241800 A1* | 10/2011 | Yokoyama | H03H 3/04 333/188 |
| 2012/0056694 A1 | 3/2012 | Pang et al. | |
| 2012/0218057 A1 | 8/2012 | Burak et al. | |
| 2013/0021304 A1 | 1/2013 | Zuo et al. | |
| 2013/0038408 A1 | 2/2013 | Burak et al. | |
| 2013/0106534 A1 | 5/2013 | Burak et al. | |
| 2013/0235001 A1 | 9/2013 | Yun et al. | |
| 2014/0111288 A1 | 4/2014 | Nikkel et al. | |
| 2014/0118088 A1 | 5/2014 | Burak et al. | |
| 2014/0118091 A1 | 5/2014 | Burak et al. | |
| 2014/0292150 A1 | 10/2014 | Zou et al. | |
| 2015/0270826 A1 | 9/2015 | Burak | |

OTHER PUBLICATIONS

Co-pending U.S. Appl. No. 13/662,460, filed Oct. 27, 2012.
Co-pending U.S. Appl. No. 14/192,599, filed Feb. 27, 2014.
Co-pending U.S. Appl. No. 13/781,491, filed Feb. 28, 2013.
Marta Clement et al., "Aluminium Nitride Solidly Mounted BAW Resonators with Iridium Electrodes".
Supratik Datta, "Intro to Piezoelectric BAW Resonator Modeling," COMSOL Blog, Sep. 25, 2013, pp. 1-4.
SCIA Systems,"Frequency Trimming for Bulk Acoustic Wave Devices", MEMS—Etching: Ion Beam Trimming of Bulk Accoustic Wave Filters, http://www.scia-systems.com/applications/mems-etching/ibt-of-bawsaw.html, pp. 1-2.
Co-pending U.S. Appl. No. 14/225,710, filed Mar. 26, 2014.
Li-Wen Hung et al., "Capacitive-Piezoelectric AlN Resonators With Q>12,000", MEMS 2011, Cancun, Mexico, Jan. 23-27, 2011, pp. 173-176.
Li-Wen Hung et al. "Capacitive-Piezo Transducers for Higher Q Contour-Mode ALN Resonators at 1.2GHZ", Tech. Digest, 2008 Solid-State Sensor, Actuator, and Microsystems Workshop, Hilton Head, South Darolina, Jun. 6-10, 2010, pp. 463-466.

* cited by examiner

ACOUSTIC RESONATOR COMPRISING VERTICALLY EXTENDED ACOUSTIC CAVITY

BACKGROUND

Acoustic resonators can be used to implement signal processing functions in various electronic applications. For example, some cellular phones and other communication devices use acoustic resonators to implement frequency filters for transmitted and/or received signals. Several different types of acoustic resonators can be used according to different applications, with examples including bulk acoustic wave (BAW) resonators such as thin film bulk acoustic resonators (FBARs), coupled resonator filters (CRFs), stacked bulk acoustic resonators (SBARs), double bulk acoustic resonators (DBARs), and solidly mounted resonators (SMRs). An FBAR, for example, includes a piezoelectric layer between a bottom (first) electrode and a top (second) electrode over a cavity. BAW resonators may be used in a wide variety of electronic applications and devices, such as cellular telephones, personal digital assistants (PDAs), electronic gaming devices, laptop computers and other portable communications devices. For example, FBARs operating at frequencies close to their fundamental resonance frequencies may be used as a key component of radio frequency (RF) filters and duplexers in mobile devices.

FIG. 1 is a block diagram depicting a conventional acoustic resonator. Referring to FIG. 1, acoustic resonator 100 includes a piezoelectric layer 130 of piezoelectric material applied to a top surface of a bottom electrode 110, and a top electrode 140 applied to a top surface of the piezoelectric layer 130, resulting in a structure referred to as an acoustic stack. The acoustic stack is formed on a substrate 105 over a cavity 110 in the substrate. A planarization 120 layer may be included to provide a planarized surface on which to apply the piezoelectric layer. Where an input electrical signal is applied between the electrodes, reciprocal or inverse piezoelectric effect causes the acoustic stack to mechanically expand or contract depending on the polarization of the piezoelectric material. As the input electrical signal varies over time, expansion and contraction of the acoustic stack produces acoustic waves that propagate through the acoustic resonator in various directions and are converted into an output electrical signal by the piezoelectric effect. Some of the acoustic waves achieve resonance across the acoustic stack, with the resonant frequency being determined by factors such as the materials, dimensions, and operating conditions of the acoustic stack. These and other mechanical characteristics of the acoustic resonator determine its frequency response.

Generally, a conventional FBAR, such as acoustic resonator 100, may be designed to operate at high frequencies, such as approximately 3.6 GHz, for example. In this case, each of the bottom resonator 110 and the top resonator 140 would be formed of tungsten (W) approximately 2700 Å thick top, and the piezoelectric layer 130 would be formed of aluminum nitride (AlN) approximately 1600 Å thick. Conventionally, aggregate thickness of the acoustic stack is one half the wavelength λ (or λ/2) corresponding to the thickness extensional resonance frequency of the acoustic resonator 100.

FIG. 2 is a graph showing Normalized Peak Strain Energy (NPSE) distribution for Mason pseudo-mode across the acoustic resonator 100 in the vertical direction. The Mason pseudo-mode is motion excited by the vertical electric field in the active region of the acoustic resonator 100. Referring to FIG. 2, plot 210 shows normalized acoustic impedance to provide a position marker within the acoustic stack, and plot 320 shows the NPSE distribution. Plot 210 corresponds to the various elements of the acoustic stack, as indicated by the reference numbers between the vertical dashed lines. That is, from left to right, distinct sections of the normalized acoustic impedance correspond to the bottom electrode 110, the piezoelectric layer 130, and the top electrode 140, respectively. As shown by plot 220, the typical energy distribution for the λ/2 mode has one peak in the center of the piezoelectric layer 130 and two nulls at the metal/air surfaces (i.e., at the bottom edge (cavity 108) and the top edge of the acoustic resonator 100).

While the thickness of the bottom and top electrodes 110 and 140 may be sufficient for low series resistance, the very thin piezoelectric layer 130 (typical resonators for RF duplexers operating in 0.7 GH-2.5 GHz range would have piezoelectric layer thickness of about 5000 Å-20000 Å) poses a number of problems as outlined below.

Generally, a conventional acoustic resonator, such as acoustic resonator 100, suffers from several issues when designed for operation at high frequencies. For example, the acoustic resonator 100 would tend of have a low quality (Q) factor due to high series resistance Rs resulting from the relatively thin bottom and top electrodes 110 and 140. The acoustic resonator 100 would also tend to have low parallel resistance Rp due to the relatively thin piezoelectric layer 130, resulting in small area. Furthermore, the piezoelectric layer 100 would be susceptible to electro-static discharge (ESD) failures due to large electric fields, low RF power level failures due to the small area and resulting high RF-power density, and large perimeter-to-area loss due to small overall device area.

For example, acoustic resonators are generally designed to meet a specific characteristic electrical impedance $Z_0$ requirement. The characteristic electrical impedance $Z_0$ is proportional to the resonator area and inversely proportional to the desired frequency of operation and thickness of the piezoelectric layer. The thickness of the piezoelectric layer is predominantly determined by the desired frequency of operation, but also by the desired electromechanical coupling coefficient $Kt^2$. Within applicable limits, the electromechanical coupling coefficient $Kt^2$ is proportional to thickness of the piezoelectric layer and inversely proportional to thicknesses of the bottom and top electrodes. More specifically, the electromechanical coupling coefficient $Kt^2$ is proportional to the fraction of acoustic energy stored in the piezoelectric layer and inversely proportional to the fraction of acoustic energy stored in the electrodes. Thus, for a predetermined impedance $Z_0$, the resonator size, and therefore its cost, may be reduced by using piezoelectric material with higher intrinsic electromechanical coupling coefficient $kt^2$ (for instance, aluminum nitride doped with scandium), as it allows use of a thinner piezoelectric layer (and therefore reduction of the resonator area) at the expense of increasing thicknesses of the bottom and top electrodes in order to maintain the desired resonance frequency. Therefore, as mentioned above, for high-frequency applications, specific electromechanical coupling coefficient $Kt^2$, impedance $Z_0$ and operating frequency requirements will enforce reduction of the active area and piezoelectric layer thickness, and the resulting reduction of the overall quality factor Q of the device and the robustness to ESD and high RF-power failures. Therefore approaches are needed to increase the device area and piezoelectric material thickness, while preserving electromechanical coupling coefficient $Kt^2$, impedance $Z_0$ and operating frequency as determined by a specific application.

BRIEF DESCRIPTION OF THE DRAWINGS

The illustrative embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

Figure 1:
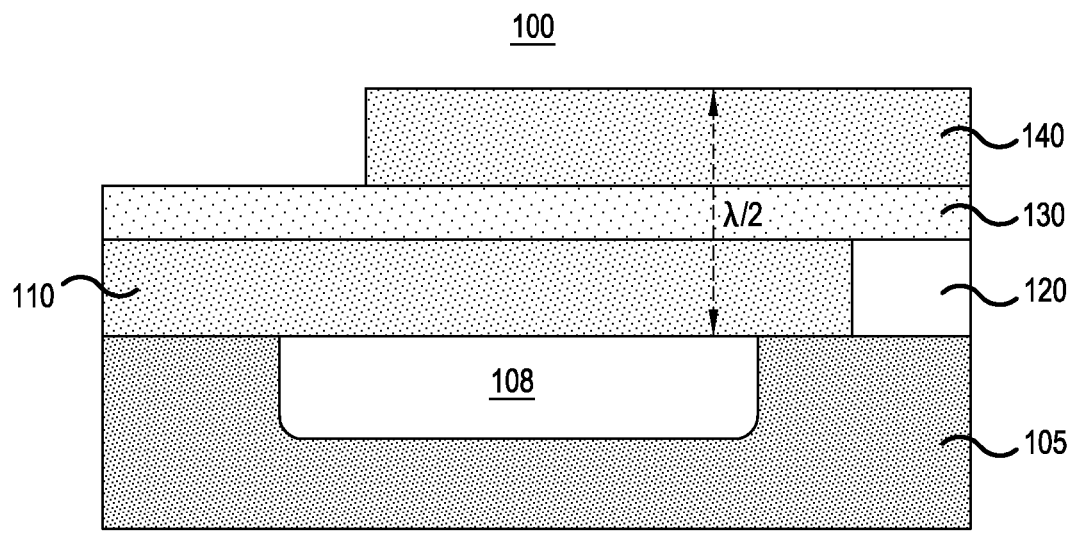
FIG. 1 is a cross-sectional view of a conventional acoustic resonator.
Figure 2:
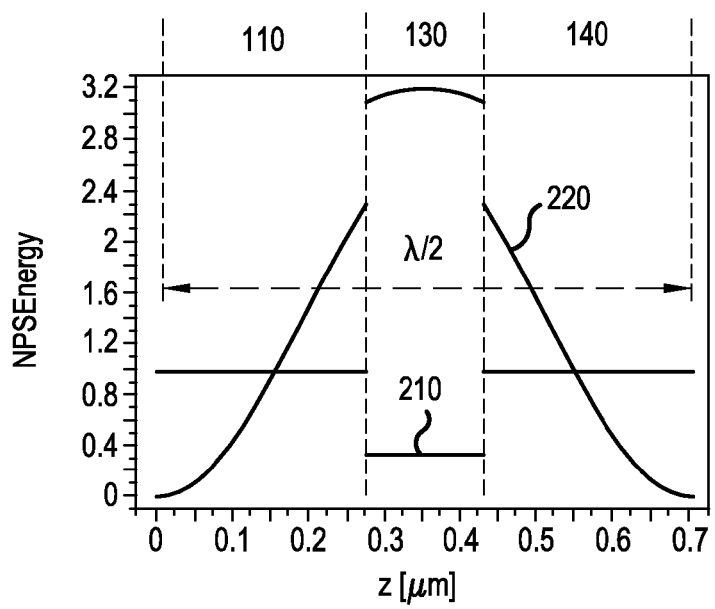
FIG. 2 is a graph showing Normalized Peak Strain Energy (NPSE) distribution across the conventional acoustic resonator in vertical direction.

In the following detailed description, for purposes of explanation and not limitation, example embodiments disclosing specific details are set forth in order to provide a thorough understanding of the present teachings. However, it will be apparent to one having ordinary skill in the art having the benefit of the present disclosure that other embodiments according to the present teachings that depart from the specific details disclosed herein remain within the scope of the appended claims. Moreover, descriptions of well-known apparatuses and methods may be omitted so as to not obscure the description of the example embodiments. Such methods and apparatuses are clearly within the scope of the present teachings.

The terminology used herein is for purposes of describing particular embodiments only, and is not intended to be limiting. The defined terms are in addition to the technical, scientific, or ordinary meanings of the defined terms as commonly understood and accepted in the relevant context.

The terms "a", "an" and "the" include both singular and plural referents, unless the context clearly dictates otherwise. Thus, for example, "a device" includes one device and plural devices. The terms "substantial" or "substantially" mean to within acceptable limits or degree. The term "approximately" means to within an acceptable limit or amount to one of ordinary skill in the art. Relative terms, such as "above," "below," "top," "bottom," "upper" and "lower" may be used to describe the various elements' relationships to one another, as illustrated in the accompanying drawings. These relative terms are intended to encompass different orientations of the device and/or elements in addition to the orientation depicted in the drawings. For example, if the device were inverted with respect to the view in the drawings, an element described as "above" another element, for example, would now be below that element. Where a first device is said to be connected or coupled to a second device, this encompasses examples where one or more intermediate devices may be employed to connect the two devices to each other. In contrast, where a first device is said to be directly connected or directly coupled to a second device, this encompasses examples where the two devices are connected together without any intervening devices other than electrical connectors (e.g., wires, bonding materials, etc.).

The present teachings relate generally to acoustic resonators such as film bulk acoustic wave resonators (FBARs) or solidly mounted resonators (SMRs), although the discussion is directed to FBARs for the sake of convenience. Certain details of acoustic resonators, including materials and methods of fabrication, may be found in one or more of the following commonly owned U.S. patents and patent applications: U.S. Pat. No. 6,107,721 to Lakin; U.S. Pat. Nos. 5,587,620, 5,873,153, 6,507,983, 6,384,697, 7,275,292 and 7,629,865 to Ruby et al.; U.S. Pat. No. 7,280,007 to Feng, et al.; U.S. Patent App. Pub. No. 2007/0205850 to Jamneala et al. (issued as U.S. Pat. No. 8,981,876 on Mar. 17, 2015); U.S. Pat. No. 7,388,454 to Ruby et al.; U.S. Patent App. Pub. No. 2010/0327697 to Choy et al. (issued as U.S. Pat. No. 8,248,185 on Aug. 21, 2012); U.S. Patent App. Pub. No. 2010/0327994 to Choy et al. (issued as U.S. Pat. No. 8,902,023 on Dec. 12, 2014), U.S. patent application Ser. No. 13/658,024 to Nikkel et al. (issued as U.S. Pat. No. 9,385,684 on Jul. 5, 2016); U.S. Patent App. Pub. Nos. 2014/0118088 (issued as U.S. Pat. No. 9,425,764 on Aug. 23, 2016) and 2014/0118091 (issued as U.S. Pat. No. 9,401,692 on Jul. 26, 2016) to Burak et al.; U.S. patent application Ser. No. 13/654,718 to Burak et al. (issued as U.S. Pat. No. 9,099,983 on Aug. 4, 2015) ; U.S. Patent App. Pub. No. 2008/0258842 to Ruby et al. (issued as U.S. Pat. No. 7,714,684 on May 11, 2010); and U.S. Pat. No. 6,548,943 to Kaitila et al. The disclosures of these patents and patent applications are hereby specifically incorporated by reference in their entireties. It is emphasized that the components, materials and method of fabrication described in these patents and patent applications are representative and other methods of fabrication and materials within the purview of one of ordinary skill in the art are contemplated.

In various embodiments described below, a bulk acoustic wave (BAW) resonator having a vertically extended acoustic cavity is provided, which may be referred to as an extended cavity resonator (ECR). The BAW resonator includes a bottom electrode disposed on a substrate over a cavity formed in the substrate; a piezoelectric layer disposed on the bottom electrode, and a top electrode disposed on the piezoelectric layer. The piezoelectric layer has a thickness of approximately $\lambda/2$, wherein $\lambda$ is a wavelength corresponding to a thickness extensional resonance frequency of the BAW resonator. At least one of the bottom electrode and the top electrode comprises a composite electrode having a thickness of approximately $\lambda/2$. In this context, "approximately" is intended to cover a range of thicknesses around $\lambda/2$, e.g., from about $2\lambda/5$ (or or $\lambda/2-20$ percent) to about $3\lambda/5$ (or $\lambda/2+20$ percent), but such that the overall thickness of the acoustic stack of the BAW resonator structure is an integer multiple of $\lambda/2$. While the overall thickness of the acoustic stack in terms of $\lambda/2$ multiples is determined by the presence of air on both bottom and top sides of the resonator, the partitioning of a particular layer thickness enables design of the electromechanical coupling coefficient $Kt^2$ and the series resonance frequency Fs to application-determined target values. On the other hand, keeping the piezoelectric layer and electrode thicknesses close to the $\lambda/2$ value may be beneficial for overall device performance, as described below.

Figure 3A:
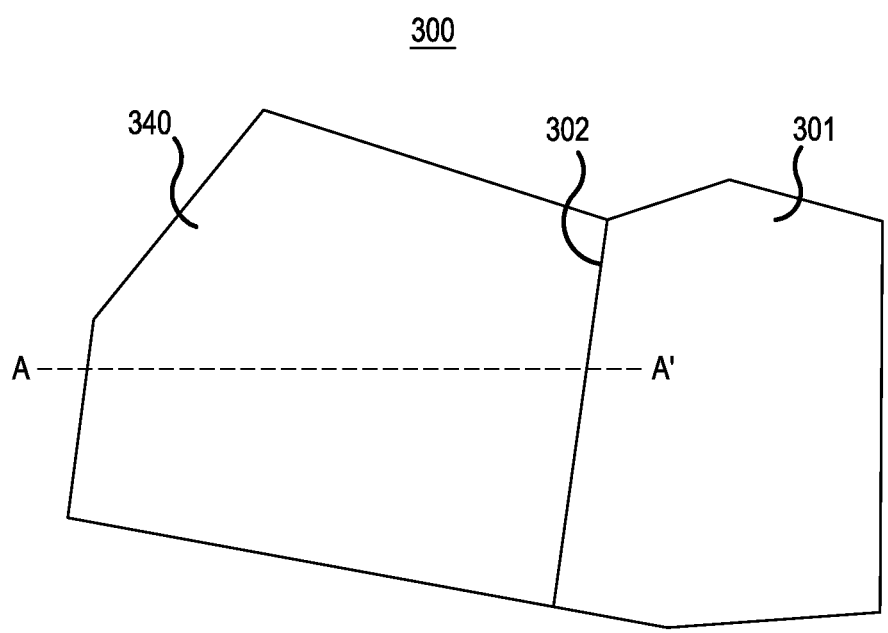
FIG. 3A is a top view of an acoustic resonator according to a representative embodiment.
Figure 3B:
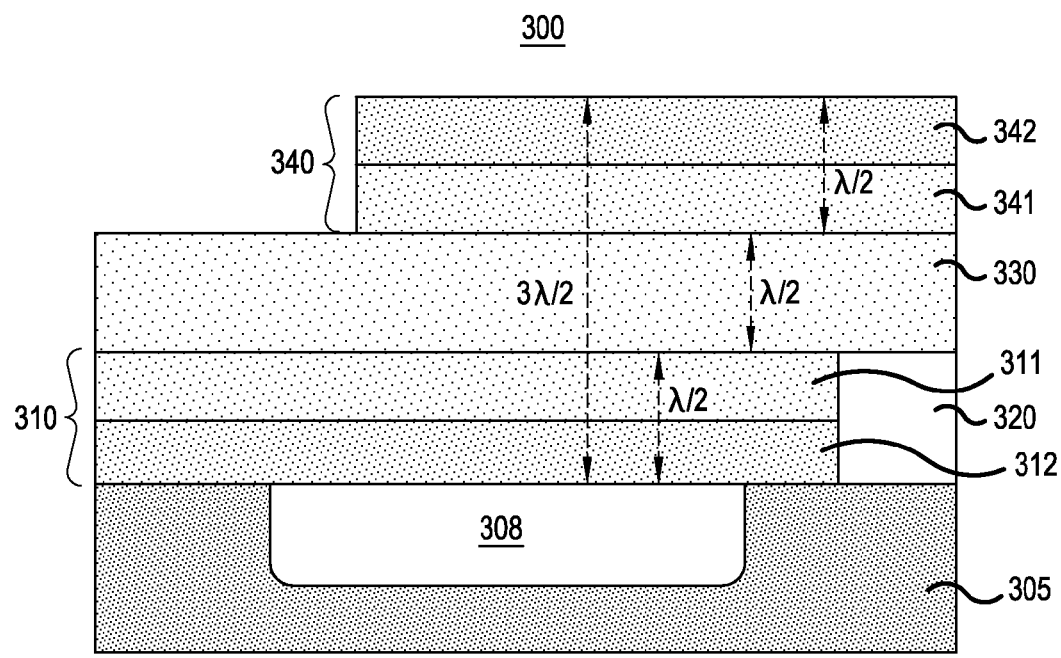
FIG. 3B is a cross-sectional view of an acoustic resonator having an extended cavity according to a representative embodiment.

FIG. 3A is a top view of an acoustic resonator 300 according to a representative embodiment, and FIG. 3B is a cross-sectional view of the acoustic resonator 300, taken along a line A-A' according to different embodiments. Notably, acoustic resonators 500, 700, 900, 1100, 1200 and 1300 depicted in FIGS. 5, 7, 9, 11, 12 and 13, respectively, may 200D the same top view and corresponding features as shown in FIG. 3A, so repetitive descriptions of these features may be omitted in an effort to avoid redundancy.

Referring to FIG. 3A, acoustic resonator 300 comprises a top electrode 340 having five (5) sides, with a connection side 301 configured to provide an electrical connection to interconnect 302. Interconnect 302 provides electrical signals to top electrode 340 to excite desired acoustic waves in a piezoelectric layer (not shown in FIG. 3A) of acoustic resonator 300.

FIG. 3B is a cross-sectional diagram illustrating acoustic resonator 300, having a vertically extended acoustic cavity, according to a representative embodiment. In the examples depicted in FIG. 3B (as well as the examples depicted in FIGS. 5, 7, 9, 11, 12 and 13, discussed below), the acoustic resonator is an FBAR, as well as an ECR, for convenience of explanation. However, it is understood that other types of acoustic resonators may be included, without departing from the scope of the present teachings. In addition, it is understood that the same general configurations may be included in acoustic resonators having frames and/or collars in various locations, without departing from the scope of the present teachings. Various examples of collars and frames, as well as related materials and operating characteristics, are described in the above cited U.S. patent application Ser. No. 13/781,491 (filed Feb. 28, 2013) to Burak et al. (issued as U.S. Pat. No. 9,490,771 on Nov. 8, 2016), and U.S. Patent Application Publication Nos. 2014/0118088 (published May 1, 2014, and issued as U.S. Pat. No. 9,425,764 on Aug. 23, 2016) and 2014/0118091 (published May 1, 2014, and issued as U.S. Pat. No. 9,401,692 on Jul. 26, 2016) to Burak et al., which are hereby incorporated by reference in their entireties.

Referring to FIG. 3B, acoustic resonator 300 comprises a substrate 305, a cavity 308 (e.g., air cavity), a bottom electrode 310 disposed on the substrate 305 over the cavity 308, and a planarization layer 320 disposed on the substrate 305 adjacent the bottom cavity to form a planarized combined top surface of the bottom electrode and the planarization layer 320. The acoustic resonator 300 further includes a piezoelectric layer 330 disposed on the bottom electrode 310 and the planarization layer 320, and a top electrode 340 disposed on the piezoelectric layer 330. Collectively, the bottom electrode 310, the piezoelectric layer 330 and the top electrode 340 constitute an acoustic stack of the acoustic resonator 300, which corresponds to an acoustic cavity. An active region of the acoustic resonator 300 (as well as the other acoustic resonators, having corresponding elements, discussed herein) is defined by overlapping portions of the bottom electrode 310, the piezoelectric layer 330, the top electrode 340 and the cavity 308.

In the depicted embodiment, each of the bottom electrode 310 and the top electrode 340 is a composite electrode, meaning that it comprises (at least) two layers formed of different metal materials. More particularly, in reference to proximity to the piezoelectric layer 330, the bottom electrode 310 includes first bottom electrode layer 311 adjacent the piezoelectric layer 330 and second bottom electrode layer 312 adjacent the first bottom electrode layer 311, and the top electrode 340 includes first top electrode layer 341 adjacent the piezoelectric layer 330 and second top electrode layer 342 adjacent the first top electrode layer 341. Generally, each of the first bottom electrode layer 311 and the first top electrode layer 341 is formed of a material having a relatively low acoustic impedance such as aluminum (Al), titanium (Ti), or beryllium (Be), while each of the second bottom electrode layer 312 and the second top electrode layer 342 is formed of a material having a relatively high acoustic impedance, such as tungsten (W), iridium (Ir), or molybdenum (Mo). Accordingly, each of the bottom electrode 310 and the top electrode 340 may function as an acoustic mirror, such as a distributed Bragg reflector (DBR), as a practical matter. Of course, the composite electrodes may comprise additional layers in various embodiments, examples of which are discussed below, without departing from the scope of the present teachings.

The acoustic resonator 300 is designed for high frequencies (e.g., 3.5 GHz and above). Accordingly, the acoustic cavity of the acoustic resonator 300 is vertically extended, e.g., in comparison to the acoustic cavity of a conventional acoustic resonator, such as acoustic resonator 100 discussed above, so that the aggregate thickness of the acoustic stack is a multiple of half the wavelength $\lambda$ (or $\lambda/2$) corresponding to the thickness extensional resonance frequency of the acoustic resonator 300. In particular, each of the bottom electrode 310, the piezoelectric layer 330 and the top electrode 340 has a thickness of approximately $\lambda/2$, so that the aggregate thickness of the acoustic resonator 300 is $3\lambda/2$. Further, in the depicted embodiment, each of the layers of the bottom and top electrodes 310 and 340 may be approximately half the aggregate wavelength thickness of the corresponding electrode. That is, each of the first bottom electrode layer 311, the second bottom electrode layer 312, the first top electrode layer 341 and the second top electrode layer 342 has a thickness of approximately λ/4, for example, although the respective thicknesses may vary to provide unique benefits for any particular situation or to meet application specific design requirements of various implementations, as would be apparent to one skilled in the art.

The substrate 305 may be formed of a material compatible with semiconductor processes, such as silicon (Si), gallium arsenide (GaAs), indium phosphide (InP), glass, sapphire, alumina, or the like, for example. The cavity 308 may be formed by etching a cavity in the substrate 305 and filling the etched cavity with a sacrificial material, such as PSG, for example, which is subsequently removed to leave an air space. Various illustrative fabrication techniques for an air cavity in a substrate are described by U.S. Pat. No. 7,345,410 (Mar. 18, 2008), to Grannen et al., which is hereby incorporated by reference in its entirety. In alternative embodiments, the cavity 308 may be replaced by a DBR, for example, without departing from the scope of the present teachings. Various illustrative fabrication techniques of acoustic mirrors are described by in U.S. Pat. No. 7,358,831 (Apr. 15, 2008), to Larson III, et al., which is hereby incorporated by reference in its entirety.

The planarization layer 320 disposed on the substrate 305 may be formed of non-etchable borosilicate glass (NEBSG), for example. Examples of potential benefits of planarization and/or method of fabricating the same are presented in U.S. Patent Application Publication No. 2013/0106534 (published May 2, 2013) to Burak et al., and U.S. patent application Ser. No. 14/225,710 (filed Mar. 26, 2014) to Nikkel et al. (published as U.S. Patent Application Publication No. 2015/0280679 on Oct. 1, 2015), which are hereby incorporated by reference in their entireties.

The piezoelectric layer 330 may be formed of any piezoelectric material compatible with semiconductor processes, such as aluminum nitride (AlN), zinc oxide (ZnO), or zirconate titanate (PZT), for example. In various embodiments, the piezoelectric layer 330 may be "doped" with at least one rare earth element, such as scandium (Sc), yttrium (Y), lanthanum (La), or erbium (Er), for example, to increase the piezoelectric coupling coefficient $e_{33}$ in the piezoelectric layer 330. Examples of doping piezoelectric layers with one or more rare earth elements for improving electromechanical coupling coefficient $Kt^2$ are provided by U.S. patent application Ser. No. 13/662,425 (filed Oct. 27, 2012), to Bradley et al. (issued as U.S. Pat. No. 9,225,313 on Dec. 29, 2015), and U.S. patent application Ser. No. 13/662,460 (filed Oct. 27, 2012), to Grannen et al. (issued as U.S. Pat. No. 9,136,819 on Sep. 15, 2015), which are hereby incorporated by reference in their entireties. Doping piezoelectric layers with one or more rare earth elements may be applied to any of the various embodiments, including the embodiments described below with reference to FIGS. 5, 7, 9, 11, 12 and 13.

Of course, other materials may be incorporated into the above and other features of acoustic resonator 300 (as well as the other acoustic resonator described herein) without departing from the scope of the present teachings.

Figure 4:
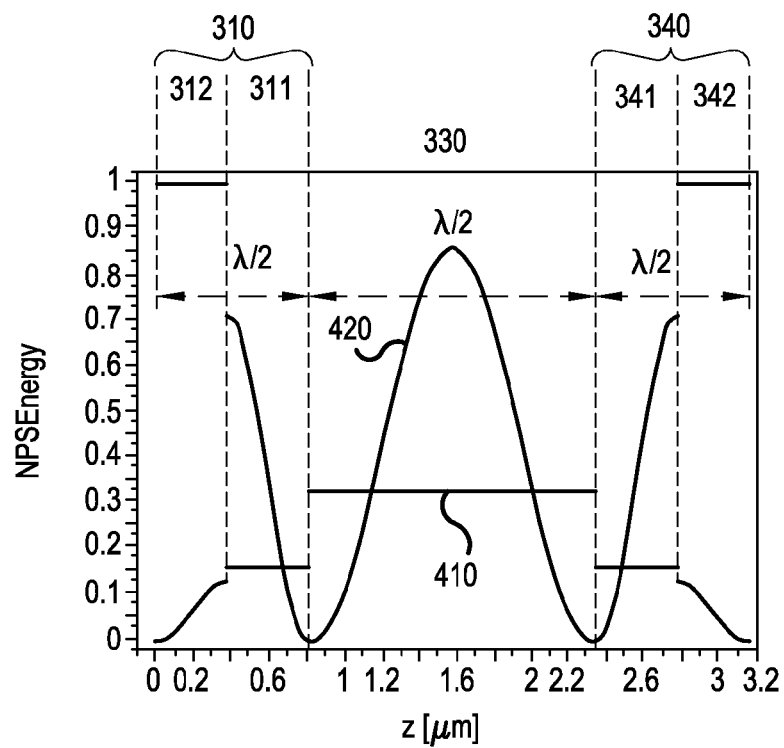
FIG. 4 is a graph showing NPSE distribution across the acoustic resonator of FIG. 3B in vertical direction according to a representative embodiment.

FIG. 4 is a graph showing NPSE distribution for Mason pseudo-mode across the acoustic resonator 300 in the vertical direction designed for operation at a high frequency (e.g., about 3.6 GHz). As discussed above, the Mason pseudo-mode is motion excited by the vertical electric field in the active region of the acoustic resonator 300.

Referring to FIG. 4, plot 410 shows normalized acoustic impedance to provide a position marker within the acoustic stack, and plot 420 shows the NPSE distribution. Plot 410 corresponds to the various elements of the acoustic stack, as indicated by the reference numbers between the vertical dashed lines. That is, from left to right, distinct sections of the normalized acoustic impedance correspond to the bottom electrode 310 (comprising the second bottom electrode layer 312 and the first bottom electrode layer 311), the piezoelectric layer 330, and the top electrode 340 (comprising the first top electrode layer 341 and the second top electrode layer 342). In the depicted example, for purposes of illustration, the second bottom electrode layer 312 is formed of W about 3600 Å thick, the first bottom electrode layer 311 is formed of Al about 4350 Å thick), the piezoelectric layer 330 is formed of AlN about 15500 Å thick, the first top electrode layer 341 is formed of Al about 4350 Å thick), and the second top electrode layer 342 is formed of W about 3600 Å thick. Of course, the materials and/or thicknesses of the different layers may vary to provide unique benefits for any particular situation or to meet application specific design requirements of various implementations, as would be apparent to one skilled in the art.

As shown by plot 420, the NPSE distribution has three peaks. The largest peak corresponds to about the center of the piezoelectric layer 330, and the other peaks correspond to the interface between the second bottom electrode layer 312 and the first bottom electrode layer 311 and the interface between the first top electrode layer 341 and the second top electrode layer 342, respectively. Plot 420 also includes four nulls, including nulls at the interfaces between the bottom electrode 310 and the piezoelectric layer 330 and between the piezoelectric layer 330 and the top electrode 340, respectively. Nulls also appear at air surfaces, including the cavity 308 and the top edge of the acoustic resonator 300.

The acoustic resonator 300 thus addresses a number of issues raised by conventional acoustic resonators operating at high values of thickness extensional resonance frequencies (e.g. 3.5 GHz and above). For example, the approximately λ/2 thick bottom and top electrodes 310 and 340 made of high-conductivity Al and W layers effectively eliminate electrical series resistance Rs contributions. Also, since the acoustic resonator 300 operates in the third harmonic (approximately λ/2 thick bottom and top electrodes 310 and 340, and approximately λ/2 thick piezoelectric layer 330), the thickness of the piezoelectric layer may increase (e.g., to about 15500 Å for 3.6 GHz top/bottom ECR), resulting in an increased area of the acoustic resonator 300, and thus a lower perimeter-to-area loss and larger parallel resistance Rp. Further, since the NPSE at the top surface of the piezoelectric layer 330 is at null of the acoustic energy density, both in the active device and in the field region outside of the active region, acoustic scattering at the edge of the top electrode 340 may be largely eliminated. This leads to natural acoustic morphing (where the cut-off frequency is substantially the same inside and outside the active region) of the acoustic resonator 300, resulting in possible increased parallel resistance Rp and wide-band (that is covering the whole pass-band of the FBAR 300) quality factor Q. Also, the bottom electrode 310, functioning as a DBR, may prevent energy leakage to the substrate 305, as in the case of conventional SMR structures.

Figure 5:
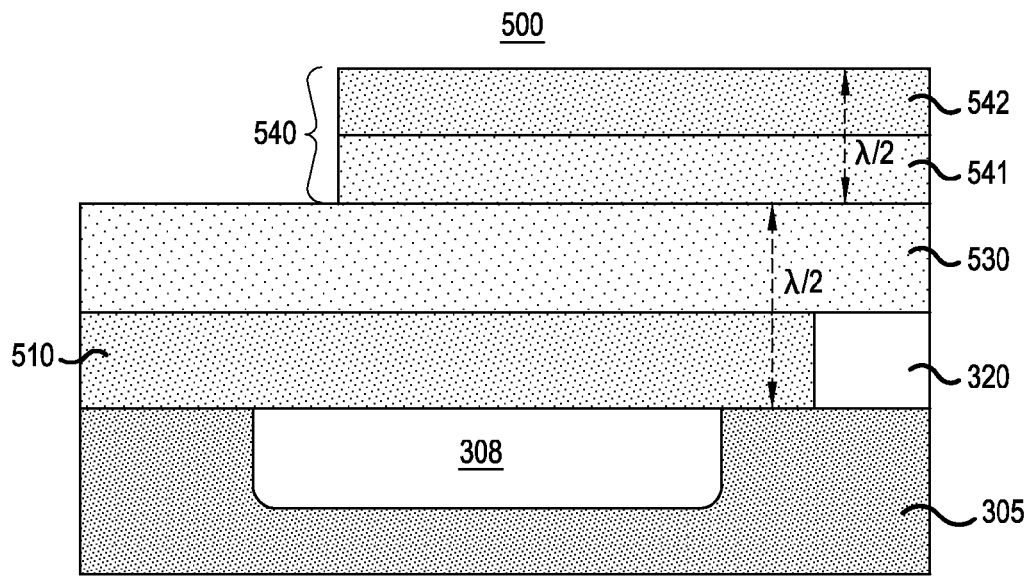
FIG. 5 is a cross-sectional view of an acoustic resonator having an extended cavity according to a representative embodiment.

FIG. 5 is a cross-sectional diagram illustrating acoustic resonator 500, having a vertically extended acoustic cavity, according to a representative embodiment.

Referring to FIG. 5, acoustic resonator 500 comprises substrate 305, cavity 308 and planarization layer 320, as discussed above. The acoustic resonator 500 further includes a bottom electrode 510 disposed on the substrate 305 over the cavity 308 and adjacent the planarization layer 320, a piezoelectric layer 530 disposed on the bottom electrode 510 and the planarization layer 320, and a top electrode 540 disposed on the piezoelectric layer 530. Collectively, the bottom electrode 510, the piezoelectric layer 530 and the top electrode 540 constitute an acoustic stack of the acoustic resonator 500, which corresponds to a vertically extended acoustic cavity.

In the depicted embodiment, only the top electrode 540 is a composite electrode. More particularly, in reference to proximity to the piezoelectric layer 530, the top electrode 540 includes first top electrode layer 541 adjacent the piezoelectric layer 530 and second top electrode layer 542 adjacent the first top electrode layer 541. Generally, the first top electrode layer 541 is formed of a material having a relatively low acoustic impedance, such as Al, Ti or Be, while second top electrode layer 542 is formed of a material having a relatively high acoustic impedance, such as W, Ir or Mo. Accordingly, the top electrode 540 may function as an acoustic mirror, such as a DBR, as a practical matter. The bottom electrode 510 may be formed of W or Mo, for example. The piezoelectric layer 530 may be formed of a material or combinations of materials, including piezoelectric material doped with one or more rare earth elements, as discussed above with reference to piezoelectric layer 330.

The acoustic resonator 500 is designed for high frequencies, and thus the acoustic cavity is vertically extended. In particular, in the depicted embodiment, a combination of the bottom electrode 510 and the piezoelectric layer 530 has a thickness of approximately $\lambda/2$, and the top electrode 540 has a thickness of approximately $\lambda/2$, so that the aggregate thickness of the acoustic resonator 500 is $\lambda$. Further, in the depicted embodiment, each of the first top electrode layer 541 and the second top electrode layer 542 may have a thickness of approximately $\lambda/4$, for example, although the respective thicknesses may vary to provide unique benefits for any particular situation or to meet application specific design requirements of various implementations, as would be apparent to one skilled in the art.

Figure 6:
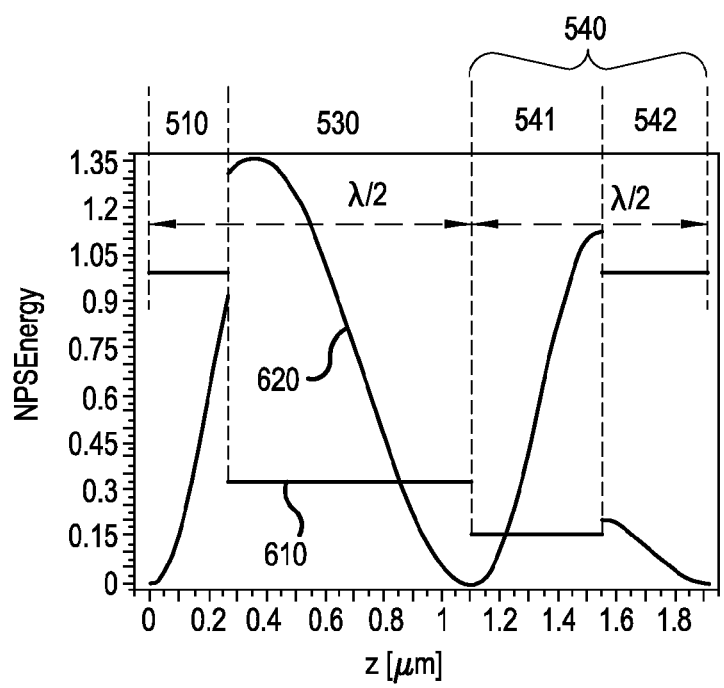
FIG. 6 is a graph showing NPSE distribution across the acoustic resonator of FIG. 5 in vertical direction according to a representative embodiment.

FIG. 6 is a graph showing NPSE distribution for Mason pseudo-mode across the acoustic resonator 500 in the vertical direction designed for operation at a high frequency (e.g., about 3.6 GHz).

Referring to FIG. 6, plot 610 shows normalized acoustic impedance to provide a position marker within the acoustic stack, and plot 620 shows the NPSE distribution. Plot 610 corresponds to the various elements of the acoustic stack, as indicated by the reference numbers between the vertical dashed lines. That is, from left to right, distinct sections of the normalized acoustic impedance correspond to the bottom electrode 510, the piezoelectric layer 530, and the top electrode 540 (comprising the first top electrode layer 541 and the second top electrode layer 542). In the depicted example, for purposes of illustration, the bottom electrode 510 is formed of W about 2600 Å thick, the piezoelectric layer 530 is formed of AlN about 8500 Å thick, the first top electrode layer 541 is formed of Al about 4350 Å thick), and the second top electrode layer 542 is formed of W about 3600 Å thick. Of course, the materials and/or thicknesses of the different layers may vary to provide unique benefits for any particular situation or to meet application specific design requirements of various implementations, as would be apparent to one skilled in the art.

As shown by plot 620, the NPSE distribution has two peaks. The larger peak corresponds to a bottom portion of the piezoelectric layer 530 near the bottom electrode 510, and the other peak corresponds to the interface between the first top electrode layer 541 and the second top electrode layer 542, respectively. Plot 620 also includes three nulls, including a null at the interface between the piezoelectric layer 530 and the top electrode 540, and nulls at the air surfaces, including the cavity 308 and the top edge of the acoustic resonator 500, respectively.

The extended cavity acoustic resonator 500 thus addresses a number of issues raised by conventional acoustic resonators operating at high thickness extensional resonance frequencies. For example, the approximately $\lambda/2$ thick top electrode 540 made of high-conductivity Al and W layers allows for acoustic morphing of the top electrode edge, as well as higher $Kt^2$ due to presence of bottom electrode 510, typically made of high acoustic impedance material. However, energy losses may be present in the region where the bottom electrode 510, the piezoelectric layer 530 and the top electrode 540 overlap the substrate 305, and the piezoelectric layer 530 is thinner for the same electromechanical coupling coefficient $Kt^2$ and series resonance frequency Fs when compared to the acoustic resonator 300, discussed above.

Figure 7:
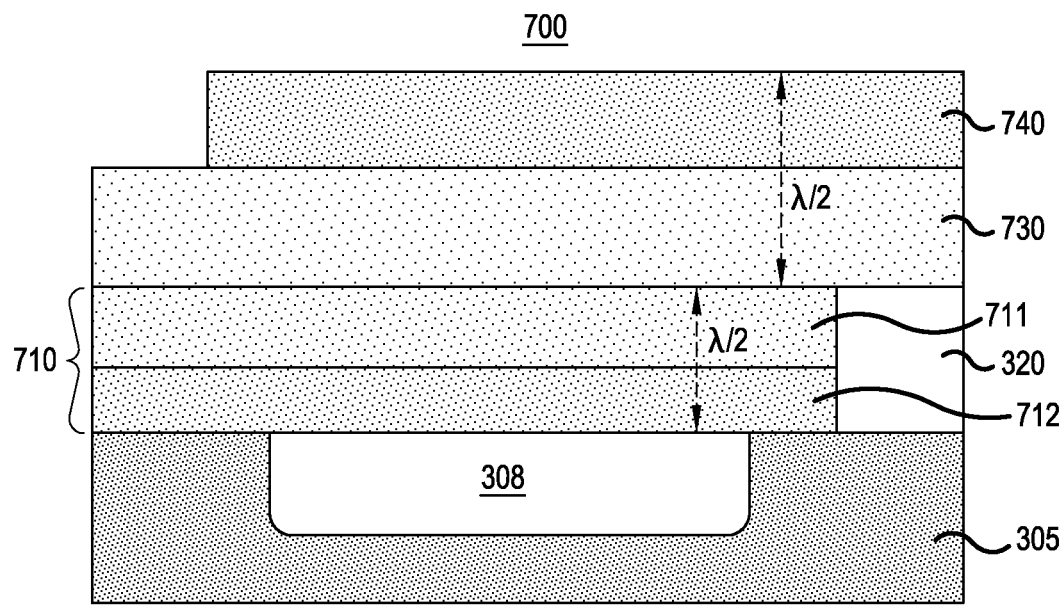
FIG. 7 is a cross-sectional view of an acoustic resonator having an extended cavity according to a representative embodiment.

FIG. 7 is a cross-sectional diagram illustrating acoustic resonator 700, having a vertically extended acoustic cavity, according to a representative embodiment.

Referring to FIG. 7, acoustic resonator 500 comprises substrate 305, cavity 308 and planarization layer 320, as discussed above. The acoustic resonator 700 further includes a bottom electrode 710 disposed on the substrate 305 over the cavity 308 and adjacent the planarization layer 320, a piezoelectric layer 730 disposed on the bottom electrode 710 and the planarization layer 320, and a top electrode 740 disposed on the piezoelectric layer 730. Collectively, the bottom electrode 710, the piezoelectric layer 730 and the top electrode 740 constitute an acoustic stack of the acoustic resonator 700, which corresponds to a vertically extended acoustic cavity.

In the depicted embodiment, only the bottom electrode 710 is a composite electrode. More particularly, in reference to proximity to the piezoelectric layer 730, the bottom electrode 710 includes first bottom electrode layer 711 adjacent the piezoelectric layer 730 and second bottom electrode layer 712 adjacent the first bottom electrode layer 711. Generally, the first bottom electrode layer 711 is formed of a material having a relatively low acoustic impedance, such as Al, Ti or Be, while second bottom electrode layer 712 is formed of a material having a relatively high acoustic impedance, such as W, Ir or Mo. Accordingly, the bottom electrode 710 may function as an acoustic mirror, such as a DBR, as a practical matter. The top electrode 740 may be formed of W or Mo, for example. The piezoelectric layer 730 may be formed of a material or combinations of materials, including piezoelectric material doped with one or more rare earth elements, as discussed above with reference to piezoelectric layer 330.

The acoustic resonator 700 is designed for high frequencies, and thus the acoustic cavity is vertically extended. In particular, in the depicted embodiment, the bottom electrode 710 has a thickness of approximately $\lambda/2$, and a combination of the piezoelectric layer 730 and the top electrode 740 has a thickness of approximately $\lambda/2$, so that the aggregate thickness of the acoustic resonator 700 is $\lambda$. Further, in the depicted embodiment, each of the first bottom electrode layer 711 and the second bottom electrode layer 712 may have a thickness of approximately $\lambda/4$, for example, although the respective thicknesses may vary to provide unique benefits for any particular situation or to meet application specific design requirements of various implementations, as would be apparent to one skilled in the art.

Figure 8:
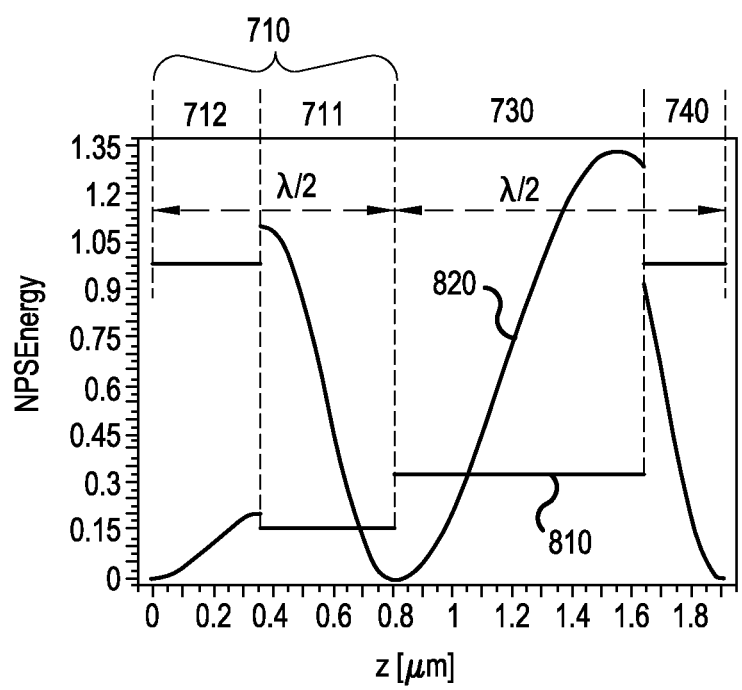
FIG. 8 is a graph showing NPSE distribution across the acoustic resonator of FIG. 7 in vertical direction according to a representative embodiment.

FIG. 8 is a graph showing NPSE distribution for Mason pseudo-mode across the acoustic resonator 700 in the vertical direction designed for operation at a high frequency (e.g., about 3.6 GHz).

Referring to FIG. 8, plot 810 shows normalized acoustic impedance to provide a position marker within the acoustic stack, and plot 820 shows the NPSE distribution. Plot 810 corresponds to the various elements of the acoustic stack, as indicated by the reference numbers between the vertical dashed lines. That is, from left to right, distinct sections of the normalized acoustic impedance correspond to the bottom electrode 710 (comprising the second bottom electrode layer 712 and the first bottom electrode layer 711), the piezoelectric layer 730, and the top electrode 740. In the depicted example, for purposes of illustration, the second bottom electrode layer 712 is formed of W about 3600 Å thick, the first bottom electrode layer 711 is formed of Al about 4350 Å thick, the piezoelectric layer 530 is formed of AlN about 8500 Å thick, and the top electrode 740 is formed of W about 2600 Å thick. Of course, the materials and/or thicknesses of the different layers may vary to provide unique benefits for any particular situation or to meet application specific design requirements of various implementations, as would be apparent to one skilled in the art.

As shown by plot 820, the NPSE distribution has two peaks. The larger peak corresponds to a top portion of the piezoelectric layer 730 near the top electrode 740, and the other peak corresponds to the interface between the first bottom electrode layer 711 and the second bottom electrode layer 712, respectively. Plot 820 also includes three nulls, including a nulls at the interface between the piezoelectric layer 730 and the bottom electrode 710, and nulls at the air surfaces, including the cavity 308 and the top edge of the acoustic resonator 700, respectively.

The extended cavity acoustic resonator 700 thus addresses a number of issues raised by conventional acoustic resonators operating at high thickness extensional resonance frequencies. For example, the approximately $\lambda/2$ thick bottom electrode 710 made of high-conductivity Al and W layers substantially eliminates acoustic losses in the region where bottom electrode 710, piezoelectric layer 730 and top electrode 740 overlaps the substrate 305, and enables higher electromechanical coupling coefficient $Kt^2$ due to the presence of the top electrode 740 made of high acoustic impedance material. However, some acoustic scattering at the top electrode 740 may be present, and the piezoelectric layer 730 is thinner for the same electromechanical coupling coefficient $Kt^2$ and series resonance frequency Fs when compared to the acoustic resonator 300, discussed above.

Figure 9:
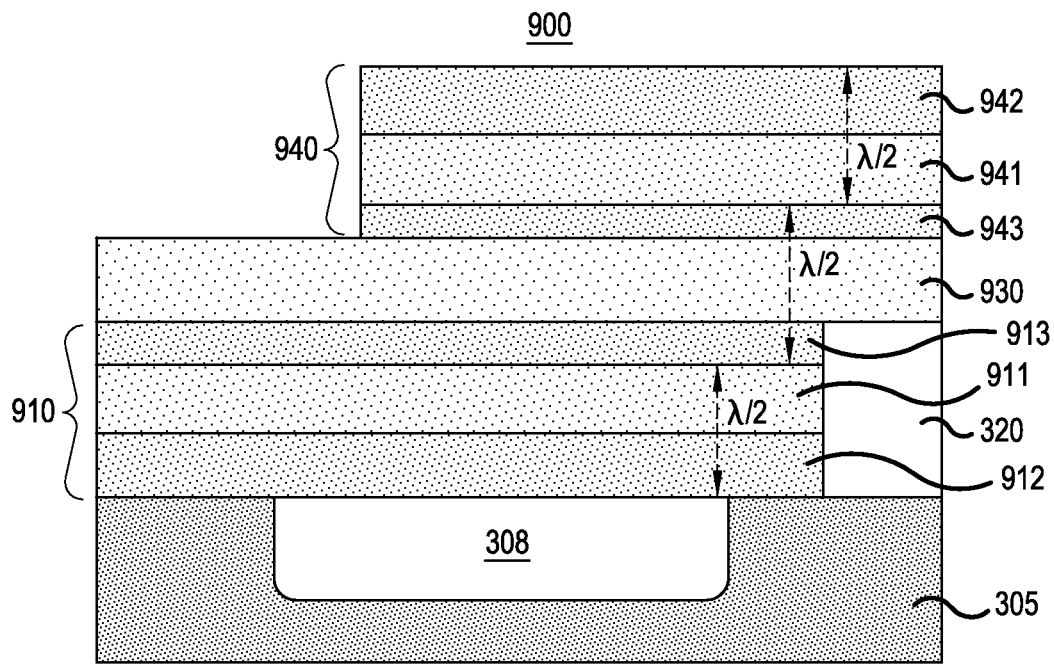
FIG. 9 is a cross-sectional view of an acoustic resonator having an extended cavity according to a representative embodiment.

FIG. 9 is a cross-sectional diagram illustrating acoustic resonator 900, having a vertically extended acoustic cavity, according to a representative embodiment.

Referring to FIG. 9, acoustic resonator 900 comprises substrate 305, cavity 308 and planarization layer 320, as discussed above. The acoustic resonator 900 further includes a bottom electrode 910 disposed on the substrate 305 over the cavity 308 and adjacent the planarization layer 320, a piezoelectric layer 930 disposed on the bottom electrode 910 and the planarization layer 320, and a top electrode 940 disposed on the piezoelectric layer 930. Collectively, the bottom electrode 910, the piezoelectric layer 930 and the top electrode 940 constitute an acoustic stack of the acoustic resonator 900, which corresponds to a vertically extended acoustic cavity.

The acoustic resonator 900 in the depicted embodiment is substantially similar to the acoustic resonator 300 in FIG. 3, except that a thin electrode layer has been added adjacent to the top and bottom surfaces of the piezoelectric layer 930 (making the piezoelectric layer 930 somewhat thinner than the piezoelectric layer 330). More particularly, in reference to proximity to the piezoelectric layer 930, the bottom electrode 910 includes thin bottom electrode layer 913 adjacent the piezoelectric layer 930, first bottom electrode layer 911 adjacent the thin bottom electrode layer 913, and second bottom electrode layer 912 adjacent the first bottom electrode layer 911. Similarly, the top electrode 940 includes thin top electrode layer 943 adjacent the piezoelectric layer 930, first top electrode layer 941 adjacent the thin top electrode layer 943, and second top electrode layer 942 adjacent the first top electrode layer 941. Generally, each of the thin bottom electrode layer 913 and the thin top electrode layer 943 is formed of a material having a relatively high acoustic impedance, such as W, Ir or Mo, each of the first bottom electrode layer 911 and the first top electrode layer 941 is formed of a material having a relatively low acoustic impedance, such as Al, Ti or Be, while each of the second bottom electrode layer 912 and the second top electrode layer 942 is formed of a material having a relatively high acoustic impedance, such as W, Ir or Mo. Accordingly, the bottom electrode 910 and the top electrode 940 may function as acoustic mirrors, such as DBRs, as a practical matter.

The acoustic resonator 900 is designed for high frequencies, and thus the acoustic cavity is vertically extended. In particular, in the depicted embodiment, a combination of first and second bottom electrode layers 911 and 912 of the bottom electrode 910 has a thickness of approximately $\lambda/2$, a combination of the piezoelectric layer 930 and the thin bottom and top electrode layers 913 and 943 has a thickness of approximately $\lambda/2$, and a combination of first and second top electrode layers 941 and 942 of the top electrode 940 has a thickness of approximately $\lambda/2$, so that the aggregate thickness of the acoustic resonator 900 is $3\lambda/2$. Further, in the depicted embodiment, each of the first bottom electrode layer 911 and the second bottom electrode layer 912 may have a thickness of approximately $\lambda/4$, and each of the first top electrode layer 941 and the second top electrode layer 942 may have a thickness of approximately $\lambda/4$, for example, although the respective thicknesses may vary to provide unique benefits for any particular situation or to meet application specific design requirements of various implementations, as would be apparent to one skilled in the art.

Figure 10:
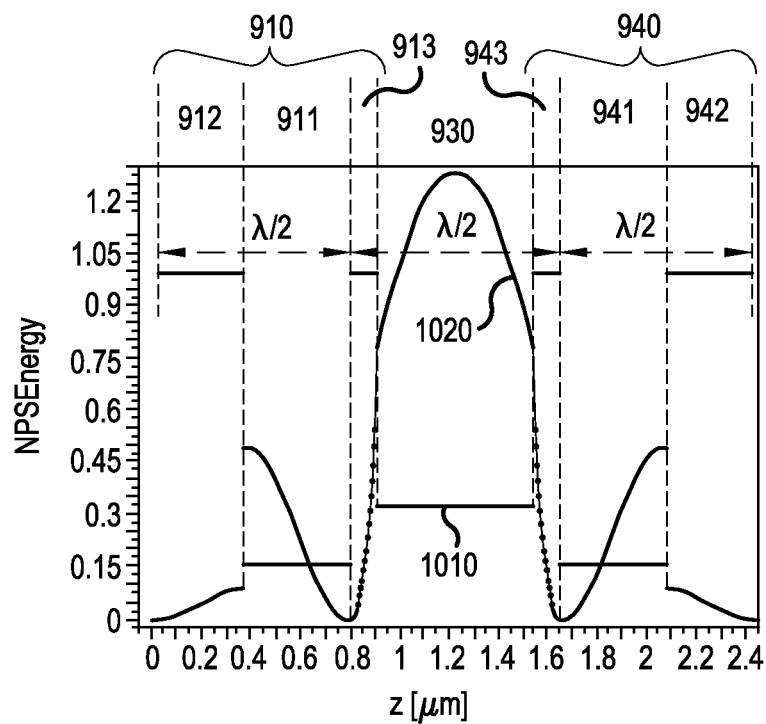
FIG. 10 is a graph showing NPSE distribution across the acoustic resonator of FIG. 9 in vertical direction according to a representative embodiment.

FIG. 10 is a graph showing NPSE distribution for Mason pseudo-mode across the acoustic resonator 900 in the vertical direction operation at a high frequency (e.g., about 3.6 GHz).

Referring to FIG. 10, plot 1010 shows normalized acoustic impedance to provide a position marker within the acoustic stack, and plot 1020 shows the NPSE distribution. Plot 1010 corresponds to the various elements of the acoustic stack, as indicated by the reference numbers between the vertical dashed lines. That is, from left to right, distinct sections of the normalized acoustic impedance correspond to the bottom electrode 910 (comprising the second bottom electrode layer 912, the first bottom electrode layer 911 and the thin bottom electrode layer 913), the piezoelectric layer 930, and the top electrode 940 (comprising the thin top electrode layer 943, the first top electrode layer 941 and the second top electrode layer 942). In the depicted example, for purposes of illustration, the second bottom electrode layer 912 is formed of W about 3600 Å thick, the first bottom electrode layer 911 is formed of Al about 4350 Å thick and the thin bottom electrode layer 913 is formed of W about 1000 Å thick, the piezoelectric layer 930 is formed of AlN about 6400 Å thick, the thin top electrode layer 943 is formed of W about 1000 Å thick, the first top electrode layer 941 is formed of Al about 4350 Å thick and the second top electrode layer 942 is formed of W about 3600 Å thick. Of course, the materials and/or thicknesses of the different layers may vary to provide unique benefits for any particular situation or to meet application specific design requirements of various implementations, as would be apparent to one skilled in the art.

As shown by plot 1020, the NPSE distribution has three peaks. The largest peak corresponds to about the center of the piezoelectric layer 930, and the other peaks correspond to the interface between the second bottom electrode layer 912 and the first bottom electrode layer 911 and the interface between the first top electrode layer 941 and the second top electrode layer 942, respectively. Plot 1020 also includes four nulls, including nulls at the interfaces between the first bottom electrode layer 911 and the thin bottom electrode layer 913, and between the thin top electrode layer 943 and the first top electrode layer 941, respectively. Nulls also appear at air surfaces, including the cavity 308 and the top edge of the acoustic resonator 900.

The extended cavity acoustic resonator 900 addresses various issues raised by similar acoustic resonators operating at high resonance frequencies, without the thin bottom and top electrode layers 913 and 943, such as acoustic resonator 300 discussed above with reference to FIG. 3, for example. From the physics point of view, for example, ECR concerns may include energy penetration into the bottom and top electrodes (310 and 340) resulting in low electromechanical coupling coefficient $Kt^2$ (e.g., up to 2 percent lower than a bare piezoelectric slab (that is a single layer of piezoelectric material without electrode layers below and above it)), narrow frequency gap between the operating resonance (e.g. TE1 for the piezoelectric slab) and first higher order shear resonance (e.g. TS2 for a piezoelectric slab) or equivalently low fractional frequency separation (FFS) of the piezoelectric layer (330) of about 13 percent (e.g., about the same as for bare piezoelectric slab, where TS2/TE1 FFS is defined as (TS2−TE1)/TE1 for a resonator operating at TE1 resonance), resulting in large acoustic loss per unit perimeter length, and enhanced viscous loss in the piezoelectric layer (330) due to the presence of the energy peaks at the interfaces between the first and second bottom electrode layers (311 and 312), and between the first and second top electrode layers (341 and 342), respectively.

The energy penetrations and the low TS4/TE3 FFS in the acoustic resonator 300 (where the operating resonance is TE3, and the next higher order shear resonance is TS4) may be addressed by inclusion of the thin bottom and/or top electrode layers 913 and 943 (e.g., formed of W, Ir or Mo) on either or both sides of the piezoelectric layer 930. In particular, adding the thin bottom and top electrode layers 913 and 943 (formed of W about 1000 Å thick, for example) on both sides of the piezoelectric layer 930 increases FFS from approximately 13 percent to approximately 22 percent, and increases electromechanical coupling coefficient $Kt^2$ from approximately 3.6 percent to approximately 5 percent. However, tradeoffs include losing some of the benefit of acoustic morphing at the top electrode edge, resulting in more acoustic scattering, and having a thinner piezoelectric layer.

Figure 11:
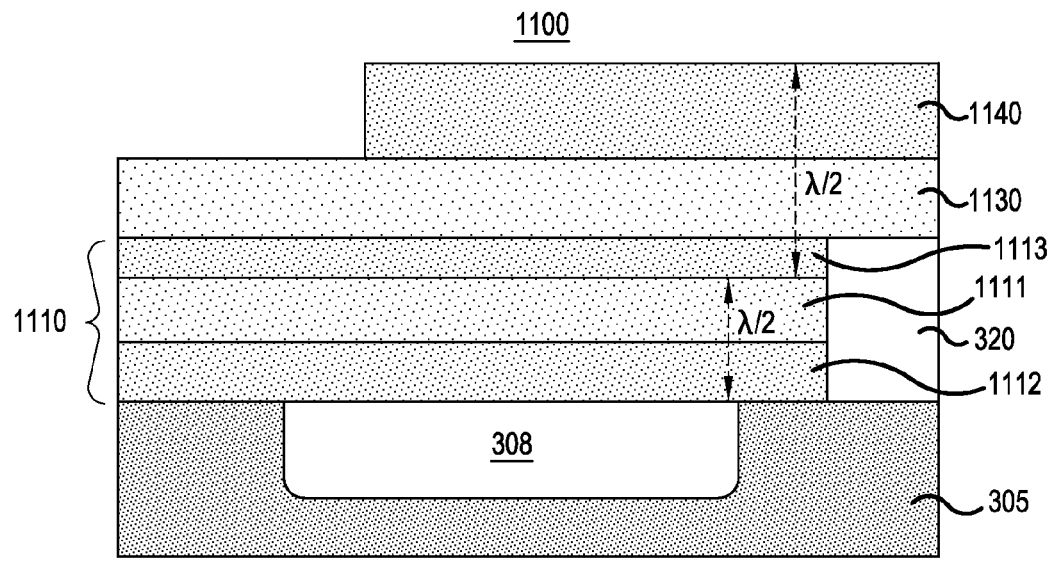
FIG. 11 is a cross-sectional view of an acoustic resonator having an extended cavity according to a representative embodiment.
Figure 12:
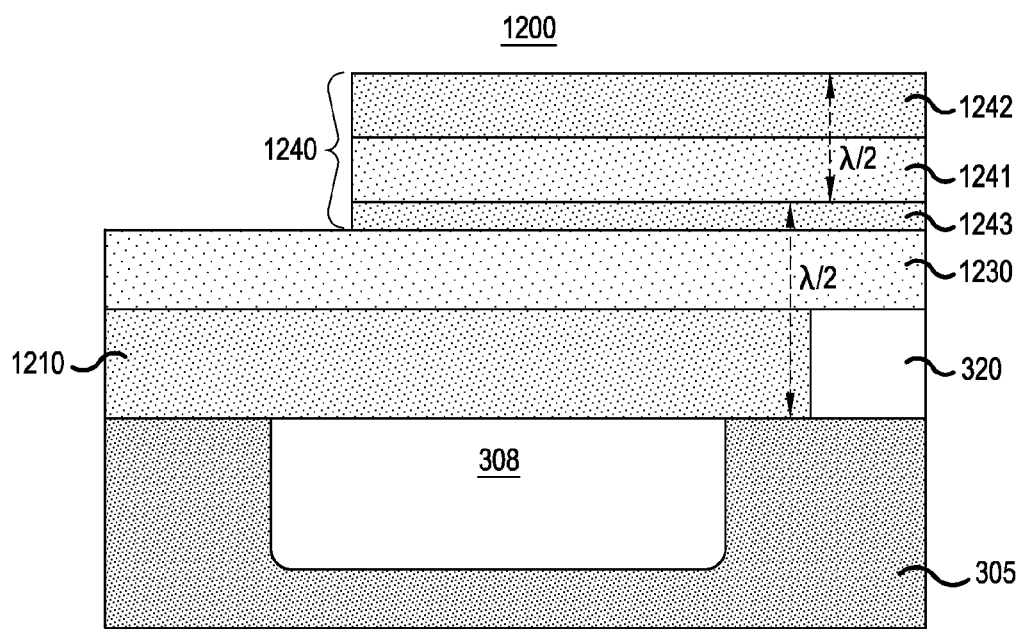
FIG. 12 is a cross-sectional view of an acoustic resonator having an extended cavity according to a representative embodiment.

FIGS. 11 and 12 are cross-sectional views of acoustic resonator, including thin electrode layers in one of the bottom and top electrodes, respectively, according to representative embodiments.

Referring to FIG. 11, acoustic resonator 1100 comprises substrate 305, cavity 308 and planarization layer 320, as discussed above. The acoustic resonator 1100 further includes a bottom electrode 1110 disposed on the substrate 305 over the cavity 308 and adjacent the planarization layer 320, a piezoelectric layer 1130 disposed on the bottom electrode 1110 and the planarization layer 320, and a top electrode 1140 disposed on the piezoelectric layer 1130. Collectively, the bottom electrode 1110, the piezoelectric layer 1130 and the top electrode 1140 constitute an acoustic stack of the acoustic resonator 1100, which corresponds to a vertically extended acoustic cavity.

In the depicted embodiment, only the bottom electrode 1110 is a composite electrode including a thin electrode layer. More particularly, in reference to proximity to the piezoelectric layer 1130, the bottom electrode 1110 includes thin bottom electrode layer 1113 adjacent the piezoelectric layer 1130, first bottom electrode layer 1111 adjacent the thin bottom electrode layer 1113, and second bottom electrode layer 1112 adjacent the first bottom electrode layer 1111. The top electrode 1140 includes a single conductive layer. Generally, each of the thin bottom electrode layer 1113 and the second bottom electrode layer 1112 is formed of a material having a relatively high acoustic impedance, such as W, Ir or Mo, and the first bottom electrode layer 1111 is formed of a material having a relatively low acoustic impedance, such as Al, Ti or Be. Accordingly, the bottom electrode 1110 may function as an acoustic mirror, such as a DBR, as a practical matter. The top electrode 1140 may be formed of W, Ir or Mo, for example.

The acoustic resonator 1100 is designed for high frequencies, and thus the acoustic cavity is vertically extended. In particular, in the depicted embodiment, a combination of the first and second bottom electrode layers 1111 and 1112 of the bottom electrode 1110 has a thickness of approximately $\lambda/2$, and a combination of the thin bottom electrode layer 1113, the piezoelectric layer 1130 and the top electrode 1140 has a thickness of approximately $\lambda/2$, so that the aggregate thickness of the acoustic resonator 1100 is $\lambda$. Further, in the depicted embodiment, each of the first bottom electrode layer 1111 and the second bottom electrode layer 1112 may have a thickness of approximately $\lambda/4$, for example, although the respective thicknesses may vary to provide unique benefits for any particular situation or to meet application specific design requirements of various implementations, as would be apparent to one skilled in the art.

Referring to FIG. 12, acoustic resonator 1200 comprises substrate 305, cavity 308 and planarization layer 320, as discussed above. The acoustic resonator 1200 further includes a bottom electrode 1210 disposed on the substrate 305 over the cavity 308 and adjacent the planarization layer 320, a piezoelectric layer 1230 disposed on the bottom electrode 1210 and the planarization layer 320, and a top electrode 1240 disposed on the piezoelectric layer 1230. Collectively, the bottom electrode 1210, the piezoelectric layer 1230 and the top electrode 1240 constitute an acoustic stack of the acoustic resonator 1200, which corresponds to a vertically extended acoustic cavity.

In the depicted embodiment, only the top electrode 1240 is a composite electrode including a thin electrode layer. More particularly, in reference to proximity to the piezoelectric layer 1230, the top electrode 1240 includes thin top electrode layer 1243 adjacent the piezoelectric layer 1230, first top electrode layer 1241 adjacent the thin top electrode layer 1243, and second top electrode layer 1242 adjacent the first top electrode layer 1241. The bottom electrode 1210 includes a single conductive layer. Generally, each of the thin top electrode layer 1243 and the second top electrode layer 1242 is formed of a material having a relatively high acoustic impedance, such as W, Ir or Mo, and the first top electrode layer 1241 is formed of a material having a relatively low acoustic impedance, such as Al, Ti or Be. Accordingly, the top electrode 1240 may function as an acoustic mirror, such as a DBR, as a practical matter. The bottom electrode 1210 may be formed of W, Ir or Mo, for example.

The acoustic resonator 1200 is designed for high frequencies, and thus the acoustic cavity is vertically extended. In particular, in the depicted embodiment, a combination of first and second top electrode layers 1241 and 1242 of the top electrode 1240 has a thickness of approximately $\lambda/2$, and a combination of the bottom electrode 1210, the piezoelectric layer 1230 and the thin top electrode layer 1243 has a thickness of approximately $\lambda/2$, so that the aggregate thickness of the acoustic resonator 1200 is $\lambda$. Further, in the depicted embodiment, each of the first top electrode layer 1241 and the second top electrode layer 1242 may have a thickness of approximately $\lambda/4$, for example, although the respective thicknesses may vary to provide unique benefits for any particular situation or to meet application specific design requirements of various implementations, as would be apparent to one skilled in the art.

Figure 13:
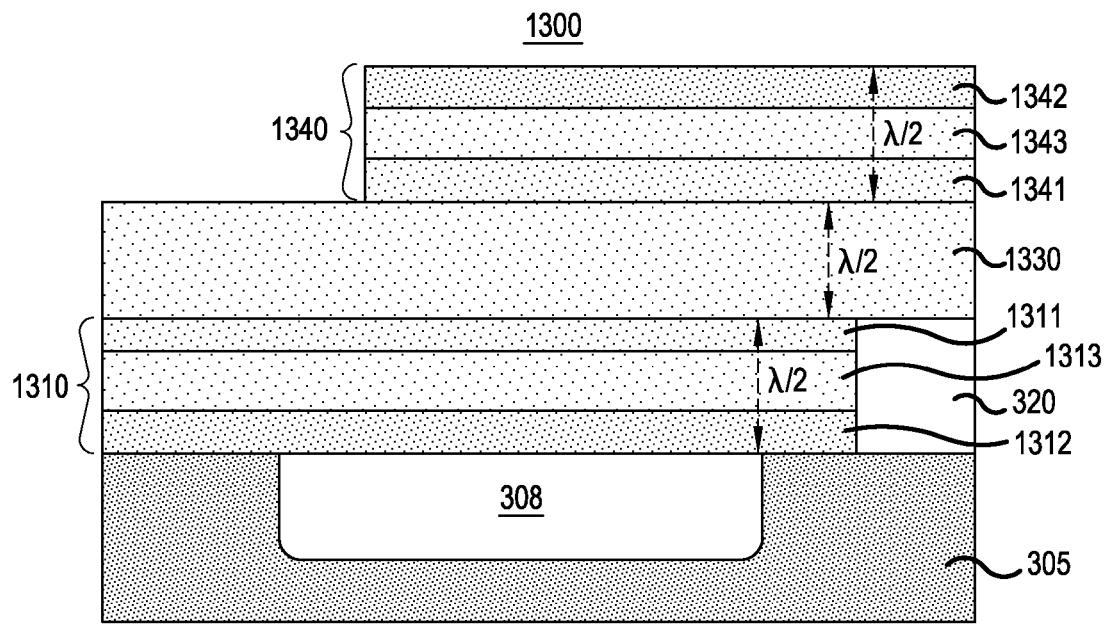
FIG. 13 is a cross-sectional view of an acoustic resonator having an extended cavity according to a representative embodiment.

FIG. 13 is a cross-sectional diagram illustrating acoustic resonator 1300, having a vertically extended acoustic cavity, according to a representative embodiment.

Referring to FIG. 13, acoustic resonator 1300 comprises substrate 305, cavity 308 and planarization layer 320, as discussed above. The acoustic resonator 1300 further includes a bottom electrode 1310 disposed on the substrate 305 over the cavity 308 and adjacent the planarization layer 320, a piezoelectric layer 1330 disposed on the bottom electrode 1310 and the planarization layer 320, and a top electrode 1340 disposed on the piezoelectric layer 1330. Collectively, the bottom electrode 1310, the piezoelectric layer 1330 and the top electrode 1340 constitute an acoustic stack of the acoustic resonator 1300, which corresponds to a vertically extended acoustic cavity.

The acoustic resonator 1300 in the depicted embodiment is substantially similar to the acoustic resonator 300 in FIG. 3, except that an intermediate impedance layer has been added between the top and bottom electrode layers in each of the top and bottom electrodes 1310 and 1340. More particularly, in reference to proximity to the piezoelectric layer 1330, the bottom electrode 1310 includes first bottom electrode layer 1311 adjacent the piezoelectric layer 1330, bottom intermediate impedance layer 1313 adjacent the first bottom electrode layer 1311, and second bottom electrode layer 1312 adjacent the bottom intermediate impedance layer 1313. Similarly, the top electrode 1340 includes first top electrode layer 1341 adjacent the piezoelectric layer 1330, top intermediate impedance layer 1343 adjacent the first top electrode layer 1341, and second top electrode layer 1342 adjacent the top intermediate impedance layer 1343.

Generally, each of the bottom and top intermediate impedance layers 1313 and 1343 is formed of a material having an intermediate impedance $Z_A$, such as AlN, for example. Also, each of the first bottom electrode layer 1311 and the first top electrode layer 1341 is formed of a material having a relatively low acoustic impedance, such as Al, Ti or Be, while each of the second bottom electrode layer 1312 and the second top electrode layer 1342 is formed of a material having a relatively high acoustic impedance, such as W, Ir or Mo. Accordingly, the bottom electrode 1310 and the top electrode 1340 may function as acoustic mirrors, such as graded DBRs with low viscous loss due to the bottom and top intermediate impedance layers 1313 and 1343, as a practical matter. In this case, peak energy in each DBR occurs in low viscous loss AlN, rather than in lossy Al, for example. Other materials with intermediate impedance (e.g., between Al and W) may be incorporated, without departing from the scope of the present teachings, as long as the materials do not lead to enhanced viscous loss.

The acoustic resonator 1300 is designed for high frequencies, and thus the acoustic cavity is vertically extended. In particular, in the depicted embodiment, a combination of first and second bottom electrode layers 1311 and 1312 and the bottom intermediate impedance layer 1313 of the bottom electrode 1310 has a thickness of approximately $\lambda/2$, the piezoelectric layer 1330 has a thickness of approximately $\lambda/2$, and a combination of first and second top electrode layers 1341 and 1342 and the top intermediate impedance layer 1343 of the top electrode 1340 has a thickness of approximately $\lambda/2$, so that the aggregate thickness of the acoustic resonator 1300 is $3\lambda/2$. Further, in the depicted embodiment, each of the first bottom electrode layer 1311 and the second bottom electrode layer 1312 may have a thickness of approximately $\lambda/8$, each of the first top electrode layer 1341 and the second top electrode layer 1342 may have a thickness of approximately $\lambda/8$, and each of the bottom and top intermediate impedance layers 1313 and 1343 may have a thickness of approximately $\lambda/4$, for example, although the respective thicknesses may vary to provide unique benefits for any particular situation or to meet application specific design requirements of various implementations, as would be apparent to one skilled in the art.

Figure 14:
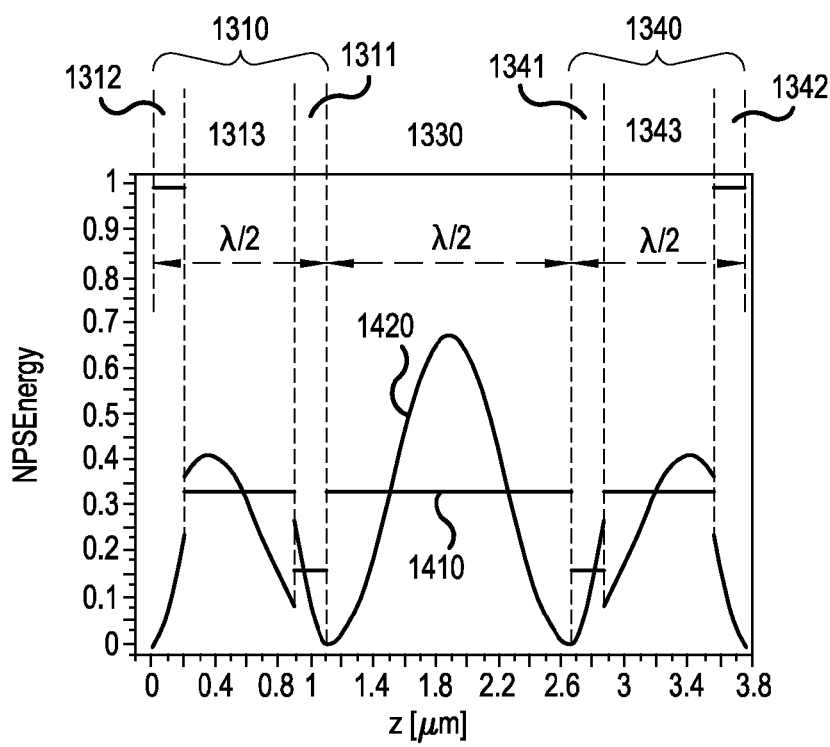
FIG. 14 is a graph showing NPSE distribution across the acoustic resonator of FIG. 13 in vertical direction according to a representative embodiment.

FIG. 14 is a graph showing NPSE distribution for Mason pseudo-mode across the acoustic resonator 1300 in the vertical direction designed for operation at a high frequency (e.g., about 3.6 GHz).

Referring to FIG. 14, plot 1410 shows normalized acoustic impedance to provide a position marker within the acoustic stack, and plot 1420 shows the NPSE distribution. Plot 1410 corresponds to the various elements of the acoustic stack, as indicated by the reference numbers between the vertical dashed lines. That is, from left to right, distinct sections of the normalized acoustic impedance correspond to the bottom electrode 1310 (comprising the second bottom electrode layer 1312, the bottom intermediate impedance layer 1313 and the first bottom electrode layer 1311), the piezoelectric layer 1330, and the top electrode 1340 (comprising the first top electrode layer 1341, the top intermediate impedance layer 1343 and the second top electrode layer 1342). In the depicted example, for purposes of illustration, the second bottom electrode layer 1312 is formed of W about 1800 Å thick, the bottom intermediate impedance layer 1313 is formed of AlN about 7000 Å thick, and the first bottom electrode layer 1311 is formed of Al about 2175 Å thick, the piezoelectric layer 1330 is formed of AlN about 15500 Å thick, the first top electrode layer 1341 is formed of Al about 2175 Å thick the top intermediate impedance layer 1343 is formed of AlN about 7000 Å thick and the second top electrode layer 1342 is formed of W about 1800 Å thick. Of course, the materials and/or thicknesses of the different layers may vary to provide unique benefits for any particular situation or to meet application specific design requirements of various implementations, as would be apparent to one skilled in the art.

As shown by plot 1420, the NPSE distribution has three peaks. The largest peak corresponds to about the center of the piezoelectric layer 1330. The two additional peaks correspond to a region near the interface between the second bottom electrode layer 1312 and the bottom intermediate impedance layer 1313 and a region near the interface between the top intermediate impedance layer 1343 and the second top electrode layer 1342, respectively. Plot 1420 also includes four nulls, including nulls at the interfaces between the first bottom electrode layer 1311 and the piezoelectric layer 1330, and between the piezoelectric layer 1330 and the first top electrode layer 1341, respectively. Nulls also appear at air surfaces, including the cavity 308 and the top edge of the acoustic resonator 1300.

In various alternative embodiments, thin bottom and/or top electrode layers, such as thin bottom and top electrode layers 913 and 943 discussed above with reference to FIG. 9, may be added to one or both of the bottom and top electrodes 1310 and 1340 of the acoustic resonator 1300. Inclusion of thin bottom and/or top electrode layers may additionally suppress energy penetration through the bottom and top electrodes 1310 and 1340, respectively. Also, in various alternative embodiments, acoustic resonators similar to acoustic resonator 1300 may be provided by including the intermediate impedance layer (and optionally the thin electrode layer) in only one of the bottom or top electrode, similar to the configurations shown in FIGS. 11 and 12, above.

Figure 16:
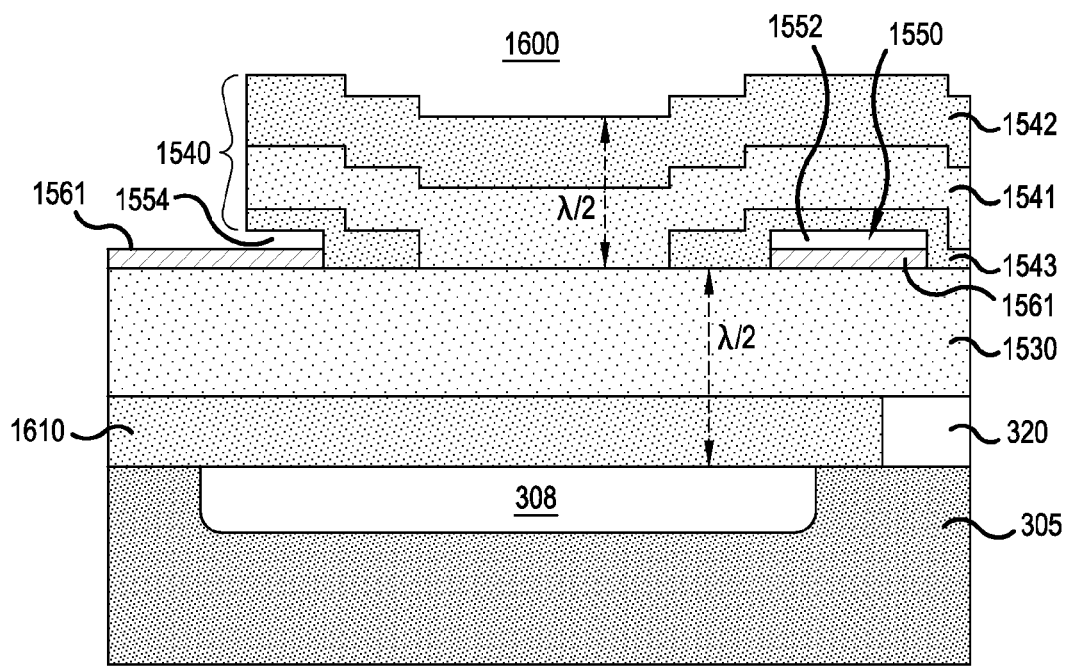
FIG. 16 is a cross-sectional view of an acoustic resonator having an extended cavity and an air-wing according to a representative embodiment.
Figure 17:
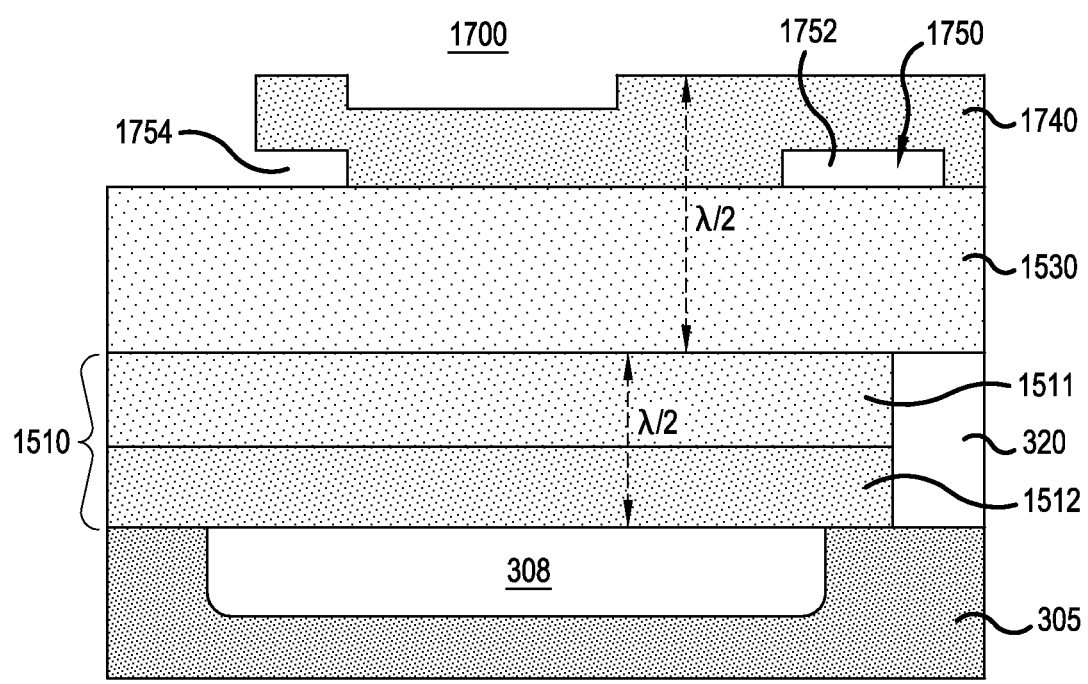
FIG. 17 is a cross-sectional view of an acoustic resonator having an extended cavity and an air-wing according to a representative embodiment.

Also, in additional embodiments, the vertically extended acoustic cavities may be combined with other features of BAW resonators. For example, FIGS. 15-17 are cross-sectional views of acoustic resonators having top-air wings together with vertically extended acoustic cavities, according to representative embodiments.

Figure 15:
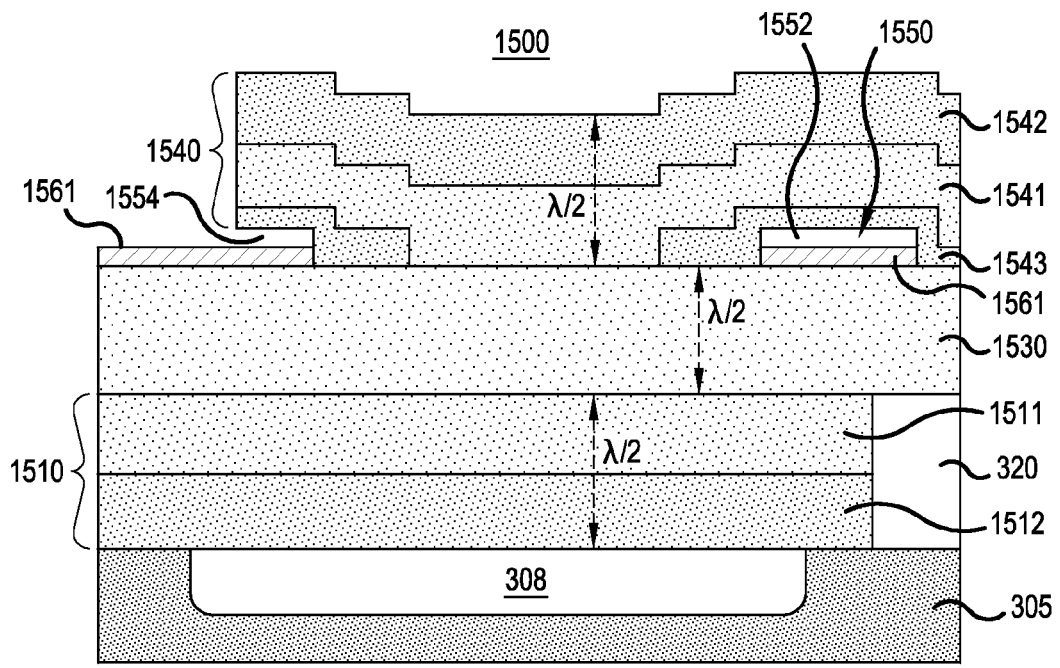
FIG. 15 is a cross-sectional view of an acoustic resonator having an extended cavity and an air-wing according to a representative embodiment.

Referring to FIG. 15, acoustic resonator 1500 is similar to acoustic resonator 300 in FIG. 3B, except that the composite top electrode forms an air-wing. Also, a thin metal layer may be included in the top electrode between the composite top electrode and the piezoelectric layer. More particularly, the acoustic resonator 1500 comprises a bottom electrode 1510 disposed on substrate 305 over cavity 308 and adjacent planarization layer 320, a piezoelectric layer 1530 disposed on the bottom electrode 1510 and the planarization layer 320, and a top electrode 1540 disposed on the piezoelectric layer 1530. Collectively, the bottom electrode 1510, the piezoelectric layer 1530 and the top electrode 1540 constitute an acoustic stack of the acoustic resonator 1500, which corresponds to a vertically extended acoustic cavity.

In the depicted embodiment, the bottom electrode 1510 is a composite electrode including first bottom electrode layer 1511 adjacent the piezoelectric layer 1530, and second bottom electrode layer 1512 adjacent the first bottom electrode layer 1511, and the top electrode 1540 is a composite electrode including first top electrode layer 1541 adjacent the piezoelectric layer 1530, and second top electrode layer 1542 adjacent the first top electrode layer 1541. The acoustic resonator 1500 further includes add-on frame 1543 adjacent to the piezoelectric layer 1530 and the first top electrode layer 1541. The add-on frame 1543 is formed along the perimeter of the active region of acoustic resonator 1500, and the first top electrode layer is formed adjacent to the piezoelectric layer 1530 in the center portion of the active region of acoustic resonator 1500. The add-on frame 1543 may be formed of W, Ir or Mo, for example. Various examples of add-on frames, as well as related materials and operating characteristics, are described in the above-mentioned U.S. Patent Application Publication No. 2014/0118088 (published May 1, 2014) to Burak et al., which is hereby incorporated by reference in its entirety.

In addition, a top air-ring 1550 is formed between the piezoelectric layer 1530 and the top electrode 1540. The top air-ring 1550 extends along all or a portion of the perimeter of the acoustic resonator 1500. In the cross-sectional view, the top air-ring 1550 includes an air-bridge 1552 and an air-wing 1554. The width of the air-bridge 1552 defines an air-bridge extension region adjacent the active region and the width of the air-wing 1554 defines an air-wing region, also adjacent the active region Inner edges of the air-ring substantially define an outer boundary of the active region of the acoustic resonator 1500. More particularly, the air-bridge 1552 and the air-wing 1554 have respective inner edges that substantially define the outer boundary of the active region. Generally, the air-bridge 1552 is disposed on connection side 301 (in FIG. 3A), and therefore is enclosed by the top electrode 1540. The air-wing 1554 is disposed along the remaining sides of the acoustic resonator 1500 (i.e., along the remaining perimeter), and therefore is open on one side. Examples of potential benefits of air-bridges and/or air-wings and corresponding fabrication techniques are presented in U.S. patent application Ser. No. 14/192,599 (filed Feb. 27, 2014) to Burak et al. (published as U.S. Patent Application Publication No. 2014/0176261 on Jun. 26, 2014), and U.S. patent application Ser. No. 14/225,710 (filed Mar. 26, 2014) to Nikkel et al. (published as U.S. Patent Application Publication No. 2015/0280679 on Oct. 1, 2015), U.S. Patent Application Publication No. 2012/0218057 (published Aug. 30, 2012) to Burak et al. (issued as U.S. Pat. No. 9,203,374 on Dec. 1, 2015), U.S. Patent Application Publication No. 2010/0327697 (published Dec. 30, 2010, and issued as U.S. Pat. No. 8,248,185 on Aug. 21, 2012) to Choy et al.; and U.S. Patent Application Publication No. 2010/0327994 (published Dec. 30, 2010, and issued as U.S. Pat. No. 8,902,023 on Dec. 12, 2014) to Choy et al., the disclosures of which are hereby incorporated by reference in their entireties.

Additionally, in the depicted embodiment, collar 1561 is formed on the top surface of the piezoelectric layer 1530 within the air-bridge 1552 and the air-wing 1554. The collar 1561 may be formed of NEBSG, for example, to provide weak mass-loading outside the active region, which may help suppress "rattles," for example, in the electrical response of acoustic resonator 1500 for frequencies below series resonance frequency Fs. Thus, the collar 1561 provides weak mass-loading of a region outside an edge of the top electrode 1540, improving parallel resistance Rp and wide-band quality factor Q simultaneously. Notably, a collar 1561 may be formed on the top surface of the piezoelectric layer adjacent to the top electrode (such as piezoelectric layer 930 and top electrode 940 in FIG. 9) of any of the embodiments discussed above to similarly provide loading outside the active region, without departing from the scope of the present teachings.

Generally, the second top electrode layer 1542 is formed of a material having a relatively high acoustic impedance, such as W, Ir or Mo, and the first top electrode layer 1511 is formed of a material having a relatively low acoustic impedance, such as Al, Ti or Be. In the bottom electrode 1510, the first bottom electrode layer 1511 is formed of a material having a relatively low acoustic impedance, such as Al, Ti or Be, and second bottom electrode is formed of a material having a relatively high acoustic impedance, such as W, Ir or Mo, for example. Accordingly, each of the top electrode 1540 and the bottom electrode 1510 may function as an acoustic mirror, such as a DBR, as a practical matter.

Also, as discussed above, the acoustic resonator 1500 is designed for high frequencies, and thus the acoustic cavity is vertically extended. In particular, in the depicted embodiment, a combination of the first and second bottom electrode layers 1511 and 1512 of the bottom electrode 1510 has a thickness of approximately $\lambda/2$, the piezoelectric layer 1530 has a thickness of approximately $\lambda/2$, and a combination of the first and second top electrode layer 1541 and 1542 of the top electrode 1540 has a thickness of approximately $\lambda/2$, so that the aggregate thickness of the acoustic resonator 1500 is $3\lambda/2$. Further, in the depicted embodiment, each of the first bottom electrode layer 1511, the second bottom electrode layer 1512, the first top electrode layer 1541, and the second top electrode layer 1542 may have a thickness of approximately $\lambda/4$, for example, although the respective thicknesses may vary to provide unique benefits for any particular situation or to meet application specific design requirements of various implementations, as would be apparent to one skilled in the art.

Referring to FIG. 16, acoustic resonator 1600 is substantially similar to acoustic resonator 1500 in FIG. 15, discussed above, except that the bottom electrode 1610 is not a composite electrode. Rather, the bottom electrode 1610 is formed of a single metal layer, such as W, Ir or Mo, for example. Also, as discussed above, the acoustic resonator 1500 is designed for high frequencies, and thus the acoustic cavity is vertically extended. Thus, in the depicted embodiment, a combination of the bottom electrode 1610 and the piezoelectric layer 1530 has a thickness of approximately $\lambda/2$, and a combination of the first and second top electrode layers 1541 and 1542 of the top electrode 1540 has a thickness of approximately $\lambda/2$, so that the aggregate thickness of the acoustic resonator 1600 is $\lambda$. Further, in the depicted embodiment, each of the first top electrode layer 1541 and the second top electrode layer 1542 may have a thickness of approximately $\lambda/4$, for example, although the respective thicknesses may vary to provide unique benefits for any particular situation or to meet application specific design requirements of various implementations, as would be apparent to one skilled in the art.

Referring to FIG. 17, acoustic resonator 1700 is substantially similar to acoustic resonator 1500 in FIG. 15, discussed above, except that the top electrode 1740 form the air-ring 1750 is not a composite electrode. Rather, the top electrode 1740 is formed of a single metal layer, such as W, Ir or Mo, for example. In the cross-sectional view, the top air-ring 1750 includes an air-bridge 1752 and an air-wing 1754, which are substantially the same as the air-bridge 1552 and an air-wing 1554, discussed above. Also, as discussed above, the acoustic resonator 1700 is designed for high frequencies, and thus the acoustic cavity is vertically extended. Thus, in the depicted embodiment, a combination of the first and second bottom electrode layers 1511 and 1512 of the bottom electrode 1510 has a thickness of approximately $\lambda/2$, and a combination of the piezoelectric layer 1530 and the top electrode 1740 has a thickness of approximately $\lambda/2$, so that the aggregate thickness of the acoustic resonator 1700 is $\lambda$. Further, in the depicted embodiment, each of the first bottom electrode layer 1511 and the second bottom electrode layer 1512 may have a thickness of approximately $\lambda/4$, for example, although the respective thicknesses may vary to provide unique benefits for any particular situation or to meet application specific design requirements of various implementations, as would be apparent to one skilled in the art.

Of course, other materials may be incorporated into the above and other features of acoustic resonators 300, 500, 700, 900, 1100, 1200, 1300, 1500, 1600 and 1700 without departing from the scope of the present teachings.

While example embodiments are disclosed herein, one of ordinary skill in the art appreciates that many variations that are in accordance with the present teachings are possible and remain within the scope of the appended claims. For instance, as indicated above, the location, dimensions, and materials of a collar and/or frames can be variously altered. In addition, other features can be added and/or removed to further improve various performance characteristics of the described devices. These and other variations would become clear to one of ordinary skill in the art after inspection of the specification, drawings and claims herein. The invention therefore is not to be restricted except within the spirit and scope of the appended claims.

The invention claimed is:

1. A bulk acoustic wave (BAW) resonator having a vertically extended acoustic cavity, the BAW resonator comprising:
   a bottom electrode disposed on a substrate over a cavity formed in the substrate;
   a piezoelectric layer disposed on the bottom electrode, the piezoelectric layer having a thickness of approximately $\lambda/2$, wherein $\lambda$ is a wavelength corresponding to a thickness extensional resonance frequency of the BAW resonator; and
   a top electrode disposed on the piezoelectric layer,
   wherein at least one of the bottom electrode and the top electrode comprises a composite electrode having a thickness of approximately $\lambda/2$.

2. The BAW resonator of claim 1, wherein the at least one of the bottom electrode and the top electrode comprising a composite electrode having a thickness of approximately $\lambda/2$ comprises:
   a first electrode layer of first material having low acoustic impedance, formed adjacent to the piezoelectric layer; and
   a second electrode layer of second material having high acoustic impedance, formed adjacent to the first electrode layer.

3. The BAW resonator of claim 2, wherein the first electrode layer comprises one of aluminum, titanium or beryllium.

4. The BAW resonator of claim 3, wherein the second electrode layer comprises one of tungsten, molybdenum or iridium.

5. The BAW resonator of claim 2, wherein each of the bottom electrode and the top electrode comprises a composite electrode having a thickness of approximately $\lambda/2$.

6. The BAW resonator of claim 5, wherein each of the first electrode layer and the second electrode layer of the bottom electrode has a thickness of approximately $\lambda/4$, and
   wherein each of the first electrode layer and the second electrode layer of the top electrode has a thickness of approximately $\lambda/4$.

7. The BAW resonator of claim 5, wherein a cut-off frequency inside an active region of the BAW resonator and a cutoff frequency outside the active region, formed between an edge of the top electrode and an edge of the cavity formed in the substrate, are substantially the same, and
   wherein the bottom electrode substantially prevents energy leakage to the substrate.

8. The BAW resonator of claim 2, wherein the top electrode comprises a composite electrode having a thickness of approximately $\lambda/2$, and
   wherein the BAW resonator further comprises an air-ring formed between the piezoelectric layer and the top electrode, an inner edge of the air-ring defining an outer boundary of an active region of the BAW resonator.

9. The BAW resonator of claim 8, further comprising:
at least one add-on frame formed along the perimeter of an active region of the BAW resonator.

10. The BAW resonator of claim 1, further comprising:
a collar for providing weak mass-loading of a region outside an edge of the top electrode, improving parallel resistance Rp and wide-band quality factor Q simultaneously.

11. The BAW resonator of claim 1, wherein the at least one of the bottom electrode and the top electrode comprising a composite electrode having a thickness of approximately $\lambda/2$ comprises:
a first electrode layer of first material having low acoustic impedance, formed adjacent to the piezoelectric layer;
an intermediate impedance layer, formed adjacent to the first electrode layer; and
a second electrode layer of second material having high acoustic impedance, formed adjacent to the intermediate impedance layer.

12. The BAW resonator of claim 11, wherein the intermediate impedance layer comprises aluminum nitride.

13. The BAW resonator of claim 11, wherein each of the bottom electrode and the top electrode comprises the first electrode layer, the intermediate impedance layer and the second electrode layer.

14. A bulk acoustic wave (BAW) resonator having a vertically extended acoustic cavity, the BAW resonator comprising:
a bottom electrode disposed on a substrate over a cavity formed in the substrate;
a piezoelectric layer disposed on the bottom electrode; and
a top electrode disposed on the piezoelectric layer,
wherein at least one of the bottom electrode and the top electrode comprises a composite electrode including a thin electrode layer of material having high acoustic impedance formed adjacent to the piezoelectric layer, a first electrode layer of first material having low acoustic impedance formed adjacent to the thin electrode layer, and a second electrode layer of second material having high acoustic impedance formed adjacent to the first electrode layer, and
wherein at least a portion of at least one of the bottom electrode and the top electrode has a thickness of approximately $\lambda/2$, wherein $\lambda$ is a wavelength corresponding to a thickness extensional resonance frequency of the BAW resonator.

15. The BAW resonator of claim 14, wherein the piezoelectric layer combined with the thin electrode layer of at least one of the bottom electrode and the top electrode has a thickness of approximately $\lambda/2$.

16. The BAW resonator of claim 14, wherein:
each of the bottom electrode and the top electrode comprises the composite electrode including the thin electrode layer, the first electrode layer, and the second electrode layer, wherein a combination of the first electrode layer and the second electrode layer of the bottom electrode has a thickness of approximately $\lambda/2$,
wherein a combination of the first electrode layer and the second electrode layer of the top electrode has a thickness of approximately $\lambda/2$, and
wherein a combination of piezoelectric layer and the thin electrode layers of the bottom and top electrodes has a thickness of approximately $\lambda/2$, resulting in an aggregate thickness of an active region of the BAW resonator of approximately $3\lambda/2$.

17. The BAW resonator of claim 14, wherein:
the top electrode comprises the composite electrode including the thin electrode layer, the first electrode layer, and the second electrode layer,
wherein a combination of the first electrode layer and the second electrode layer of the top electrode has a thickness of approximately $\lambda/2$, and
wherein a combination of the piezoelectric layer, the bottom electrode, and the thin electrode layer of the top electrode has a thickness of approximately $\lambda/2$, resulting in a total thickness of an active region of the BAW resonator of approximately $\lambda$.

18. The BAW resonator of claim 14, wherein:
the bottom electrode comprises the composite electrode including the thin electrode layer, the first electrode layer, and the second electrode layer,
wherein a combination of the first electrode layer and the second electrode layer of the bottom electrode has a thickness of approximately $\lambda/2$, and
wherein a combination of the piezoelectric layer, the top electrode, and the thin electrode layer of the bottom electrode has a thickness of approximately $\lambda/2$, resulting in a total thickness of an active region of the BAW resonator of approximately $\lambda$.

19. A bulk acoustic wave (BAW) resonator having a vertically extended acoustic cavity, the BAW resonator comprising:
a bottom electrode disposed on a substrate over a cavity formed in the substrate;
a piezoelectric layer disposed on the bottom electrode, the piezoelectric layer having a thickness of approximately $\lambda/2$, wherein $\lambda$ is a wavelength corresponding to a thickness extensional resonance frequency of the BAW resonator;
a top electrode disposed on the piezoelectric layer; and
an air-ring formed between the piezoelectric layer and the top electrode, an inner edge of the air-ring defining an outer boundary of an active region of the BAW resonator,
wherein at least one of the bottom electrode and the top electrode comprises a composite electrode having a first electrode layer of first material with low acoustic impedance formed adjacent to the piezoelectric layer and a second electrode layer of second material with high acoustic impedance formed adjacent to the first electrode layer, and
wherein a thickness of the at least one of the bottom electrode and the top electrode is approximately $\lambda/2$.

20. The BAW resonator of claim 19, further comprising:
a collar formed on the piezoelectric layer within the air-ring.

* * * * *